United States Patent
Hsu et al.

(10) Patent No.: US 12,360,184 B2
(45) Date of Patent: Jul. 15, 2025

(54) RADIO-FREQUENCY FIELD INHOMOGENEITY CORRECTION IN MAGNETIC RESONANCE IMAGING

(71) Applicant: Siemens Healthineers Digital Technology (Shanghai) Co., Ltd., Shanghai (CN)

(72) Inventors: Yi-Cheng Hsu, Taipei (TW); Ying Hua Chu, Taipei (TW); Patrick Liebig, Erlangen (DE)

(73) Assignee: Siemens Healthineers AG, Erlangen (DE)

( * ) Notice: Subject to any disclaimer, the term of this patent is extended or adjusted under 35 U.S.C. 154(b) by 139 days.

(21) Appl. No.: 18/127,825

(22) Filed: Mar. 29, 2023

(65) Prior Publication Data
US 2023/0314535 A1   Oct. 5, 2023

(30) Foreign Application Priority Data
Mar. 30, 2022   (CN) .................. 202210326668.X

(51) Int. Cl.
  *G01R 33/24*    (2006.01)
  *G01R 33/50*    (2006.01)
  *G01R 33/565*   (2006.01)
(52) U.S. Cl.
  CPC .......... *G01R 33/246* (2013.01); *G01R 33/50* (2013.01); *G01R 33/5659* (2013.01)
(58) Field of Classification Search
  CPC ... G01R 33/246; G01R 33/50; G01R 33/5659
  See application file for complete search history.

(56) References Cited

U.S. PATENT DOCUMENTS

| 7,782,056 B2 * | 8/2010 | Noterdaeme .... G01R 33/56563 324/309 |
| 8,810,242 B2 * | 8/2014 | Dannels ............. G01R 33/5659 324/309 |

(Continued)

FOREIGN PATENT DOCUMENTS

| CN | 108013876 A | 5/2018 |
| WO | 2019232518 A1 | 12/2019 |

OTHER PUBLICATIONS

Sled John G, et al., "A Nonparametric Method for Automatic Correction Of Intensity Nonuniformity In MRI Data", IEEE Trans Med Imaging. Feb. 1998. 17(1):87-97.

(Continued)

*Primary Examiner* — Gregory H Curran
(74) *Attorney, Agent, or Firm* — Banner & Witcoff Ltd.

(57) ABSTRACT

A method and device for radio-frequency field inhomogeneity correction in magnetic resonance imaging. The method includes: obtaining a first MR image by scanning a target tissue using a first pulse sequence; obtaining a $B_1^+$ field map of the target tissue; obtaining a $B_1^-$: field map of the target tissue based on the first MR image and the $B_1^+$ field map; and performing B1 field inhomogeneity correction on a second MR image of the target tissue based on the $B_1^+$ field map and the $B_1^-$ field map, where the second MR image is an MR image obtained after scanning of the target tissue using any imaging protocol and any pulse sequence.

12 Claims, 10 Drawing Sheets

(56) References Cited

U.S. PATENT DOCUMENTS

| | | | |
|---|---|---|---|
| 10,054,658 B2* | 8/2018 | Gui | G01R 33/246 |
| 2016/0018502 A1 | 1/2016 | Wang et al. | |
| 2018/0120399 A1 | 5/2018 | Lai et al. | |
| 2019/0383889 A1* | 12/2019 | Wang | A61B 5/055 |

OTHER PUBLICATIONS

Tustison Nicholas J., et al., "N4ITK: Improved N3 Bias Correction", IEEE Trans Med Imaging. Jun. 2010. 29 (6):1310-20.

* cited by examiner

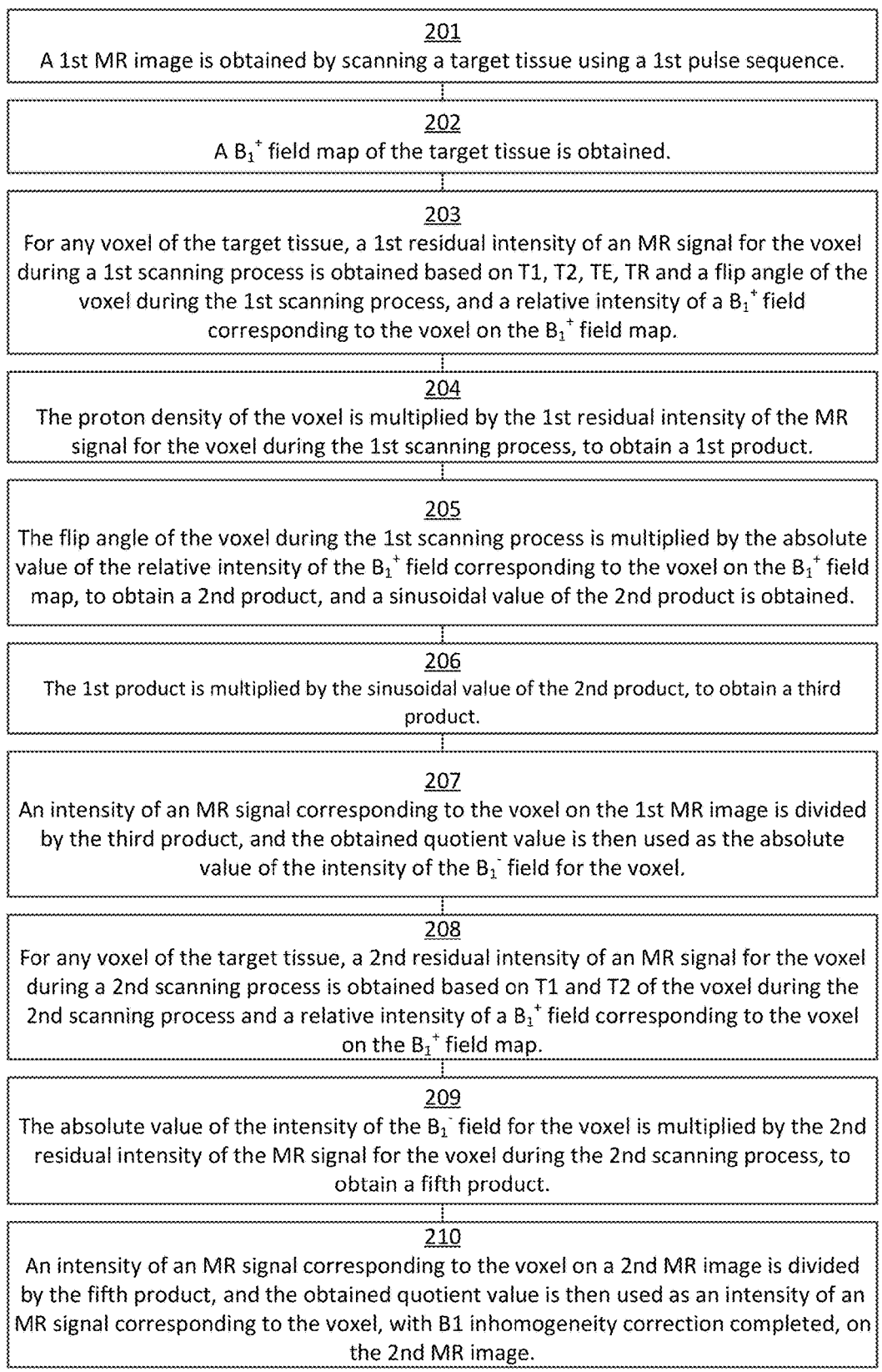

FIG 3

301
A 1st MR image is obtained by scanning a target tissue using a low-flip-angle gradient recalled echo pulse sequence.

302
A $B_1^+$ field map of the target tissue is obtained.

303
For any voxel of the target tissue, a product of a proton density of the voxel and a 1st residual intensity of an MR signal for the voxel during a 1st scanning process is set to a 1st constant.

304
The 1st constant, the flip angle of the voxel during the 1st scanning process, and the absolute value of the relative intensity of the $B_1^+$ field corresponding to the voxel on the B1+ field map are multiplied to obtain a 4th product.

305
The intensity of the MR signal corresponding to the voxel on the 1st MR image is divided by the fourth product, and the obtained quotient value is then used as the absolute value of the intensity of the $B_1^-$ field for the voxel.

306
For any voxel of the target tissue, a 2nd residual intensity of an MR signal for the voxel during a 2nd scanning process is obtained based on T1 and T2 of the voxel during the 2nd scanning process and a relative intensity of a $B_1^+$ field corresponding to the voxel on the $B_1^+$ field map. The 2nd residual intensity of the MR signal for the voxel during the 2nd scanning process is a residual intensity of the MR signal for the voxel after impacts of both the proton density and the $B_1^-$ field are removed during the 2nd scanning process, and the 2nd scanning process is a scanning process for obtaining the 2nd MR image.

307
The absolute value of the intensity of the $B_1^-$ field for the voxel is multiplied by the 2nd residual intensity of the MR signal for the voxel during the 2nd scanning process, to obtain a 5th product.

308
An intensity of an MR signal corresponding to the voxel on a 2nd MR image is divided by the fifth product, and the obtained quotient value is then used as an intensity of an MR signal corresponding to the voxel, with B1 inhomogeneity correction completed, on the 2nd MR image.

FIG 4

401
A 1st MR image is obtained by scanning a target tissue using a low-flip-angle gradient recalled echo pulse sequence.

402
A $B_1^+$ field map of the target tissue is obtained.

403
For any voxel of the target tissue, a product of a proton density of the voxel and a 1st residual intensity of an MR signal for the voxel during a 1st scanning process is set to a 1st constant.

404
The 1st constant is multiplied by the flip angle of the voxel during the 1st scanning process, to obtain a 2nd constant.

405
The intensity of the MR signal corresponding to the voxel on the 1st MR image is divided by the 2nd constant, and the obtained quotient value is then used as an absolute value of a product of the relative intensity of the $B_1^+$ field for the voxel and the intensity of the $B_1^-$ field for the voxel.

406
Upon obtaining absolute values of products of relative intensities of $B_1^+$ fields for all voxels of the target tissue and intensities of $B_1^-$ fields for all the voxels of the target tissue, the absolute values of the products of the relative intensities of the $B_1^+$ fields for all the voxels of the target tissue and the intensities of the $B_1^-$ fields for all the voxels of the target tissue are fitted using a preset three-dimensional spline fitting algorithm, to obtain a three-dimensional spline fitting plot for the absolute values of the products of the relative intensities of the $B_1^+$ fields of the target tissue and the intensities of the $B_1^-$ fields of the target tissue.

407
For any voxel of the target tissue, a signal intensity corresponding to the voxel on the three-dimensional spline fitting plot is divided by the absolute value of the relative intensity of the $B_1^+$ field corresponding to the voxel on the $B_1^+$ field map, to obtain an absolute value of the intensity of the $B_1^-$ field for the voxel.

408
For any voxel of the target tissue, a 2nd residual intensity of an MR signal for the voxel during a 2nd scanning process is obtained based on T1 and T2 of the voxel during the 2nd scanning process and a relative intensity of a $B_1^+$ field corresponding to the voxel on the $B_1^+$ field map.

409
The absolute value of the intensity of the $B_1^-$ field for the voxel is multiplied by the 2nd residual intensity of the MR signal for the voxel during the 2nd scanning process, to obtain a 5th product.

410
An intensity of an MR signal corresponding to the voxel on a 2nd MR image is divided by the fifth product, and the obtained quotient value is then used as an intensity of an MR signal corresponding to the voxel, with B1 inhomogeneity correction completed, on the 2nd MR image.

RADIO-FREQUENCY FIELD INHOMOGENEITY CORRECTION IN MAGNETIC RESONANCE IMAGING

TECHNICAL FIELD

The present disclosure relates to the technical field of magnetic resonance (MR), and in particular, to a method and device for radio-frequency field inhomogeneity correction in magnetic resonance imaging (MRI), and a magnetic resonance scanner.

BACKGROUND

The inhomogeneity of a B1 field (a radio-frequency field) is one of the main problems limiting the clinical application of MRI at an ultra-high field. The magnitude of a $B_1^+$ field (a transmit radio-frequency field) determines the flip angle in MR imaging, which angle will affect the intensity of an MR signal and the contrast of an MR image. The magnitude of a $B_1^-$ field (a receive radio-frequency field) is the receive sensitivity (where when multi-channel coils are used, the magnitude of the $B_1^-$ field is the receive sensitivity of the multi-channel coils that is obtained using a set calculation method, with the specific calculation method being determined according to actual needs), which only affects the intensity of the MR signal. The spatially varying contrast of the MR image and the intensity of the MR signal impose an impact on diagnosis, and thus correction is needed.

At present, there are mainly two methods for B1 field inhomogeneity correction. One is to provide, for MRI less than or equal to 3 T, a more homogeneous $B_1^+$ field using B1 shimming technology, which is sufficient to meet requirements of clinical application. The other is to perform image acquisition usually using coil arrays in MRI, in which the coil arrays are composed of a plurality of small coils, and each of the coils is sensitive to approaching signals, which will be converted into higher signals at the periphery of an imaging target and lower signals at the center of the imaging target, and then the signal intensity of the coil arrays is compared with the signal intensity of flat receive sensitivity of body coils, such that the magnitude of a $B_1^-$ field of the coil arrays can be estimated, thereby correcting such a nonuniform distribution of signal intensities. However, under an ultra-high field condition, B1 inhomogeneity is more serious, and neither of the above two methods can meet the clinical use.

Parallel transmission (PTx) may excite a more homogeneous flip angle by accelerating spatially selective excitations. Therefore, the problem of $B_1^+$ field inhomogeneity can theoretically be solved using parallel transmission. However, this method requires the installation of a parallel transmission system, and the residual flip angle inhomogeneity still exists. In addition, under an ultra-high field, a body coil usually does not have spatially uniform sensitivity, which means that $B_1^-$ field inhomogeneity correction cannot be performed using the above method. The most widely used post-processing method for $B_1^+$ field and $B_1^-$ field correction is nonparametric nonuniform intensity normalization (N3) and an improved variant N4ITK thereof. However, when there are highly different bias field strengths, and an image before correction has a very low signal due to a bias field effect, the assumption that the bias field ($B_1^+$ field and $B_1^-$ field) effect can be approximated as a convolution of a Gaussian function with a true tissue signal intensity distribution does not apply.

As a result, B1 field inhomogeneity is more serious for MRI under the ultra-high field, and none of the above several correction methods does apply. Therefore, the development of a method to correct B1 field inhomogeneity of an MR image is essential for the clinical application of MRI at an ultra-high field.

SUMMARY

In view of this, the aspects of the present disclosure propose a method and device for B1 field inhomogeneity correction in MRI, to optimize the effect of B1 field inhomogeneity correction in MRI.

The aspects of the present disclosure further propose a magnetic resonance scanner, to optimize the effect of B1 field inhomogeneity correction in MRI.

The technical solution of the aspects of the present disclosure is implemented as follows.

There is provided a method for radio-frequency field inhomogeneity correction in magnetic resonance imaging, the method including:
  obtaining a first magnetic resonance (MR) image by scanning a target tissue using a first pulse sequence;
  obtaining a transmit radio-frequency $B_1^+$ field map of the target tissue;
  obtaining a receive radio-frequency $B_1^-$ field map of the target tissue based on the first MR image and the $B_1^+$ field map;
  and performing B1 field inhomogeneity correction on a second MR image of the target tissue based on the $B_1^+$ field map and the $B_1^-$ field map, where the second MR image is an MR image obtained after scanning of the target tissue using any imaging protocol and any pulse sequence.

The obtaining a $B_1^-$ field map of the target tissue based on the first MR image and the $B_1^+$ field map includes:
  for any voxel of the target tissue, obtaining a first residual intensity of an MR signal for the voxel during a first scanning process based on a longitudinal relaxation time T1, a transverse relaxation time T2, an echo time TE, a repetition time TR and a flip angle of the voxel during the first scanning process, and a relative intensity of a $B_1^+$ field corresponding to the voxel on the $B_1^+$ field map, where the first residual intensity of the MR signal is a residual intensity of the MR signal for the voxel after impacts of a proton density, a sinusoidal value of a product of the flip angle and an absolute value of the relative intensity of the $B_1^+$ field, and a $B_1^-$ field are removed during the first scanning process, and the first scanning process is a scanning process for obtaining the first MR image; and
  obtaining an absolute value of an intensity of the $B_1^-$ field for the voxel based on the intensity of the MR signal corresponding to the voxel on the first MR image, the proton density of the voxel, the first residual intensity of the MR signal for the voxel, the flip angle of the voxel during the first scanning process, and the absolute value of the relative intensity of the $B_1^+$ field corresponding to the voxel on the $B_1^+$ field map, where absolute values of intensities of $B_1^-$ fields for all voxels of the target tissue constitute the $B_1^-$ field map of the target tissue.

The obtaining an absolute value of an intensity of the $B_1^-$ field for the voxel based on the intensity of the MR signal corresponding to the voxel on the first MR image, the proton density of the voxel, the first residual intensity of the MR signal for the voxel, the flip angle of the voxel during the first scanning process, and the absolute value of the relative intensity of the $B_1^+$ field corresponding to the voxel on the $B_1^+$ field map includes:

multiplying the proton density of the voxel by the first residual intensity of the MR signal, to obtain a first product; multiplying the flip angle of the voxel during the first scanning process by the absolute value of the relative intensity of the $B_1^+$ field corresponding to the voxel on the $B_1^+$ field map, to obtain a second product; obtaining a sinusoidal value of the second product; multiplying the first product by the sinusoidal value of the second product, to obtain a third product; and dividing the intensity of the MR signal corresponding to the voxel on the first MR image by the third product, and then using the obtained quotient value as the absolute value of the intensity of the $B_1^-$ field for the voxel.

The obtaining a first residual intensity of an MR signal for the voxel during a first scanning process based on T1, T2, TE, TR and a flip angle of the voxel during the first scanning process, and a relative intensity of a $B_1^+$ field corresponding to the voxel on the $B_1^+$ field map includes:

obtaining a function expression between T1, T2, TE, TR, the flip angle and the relative intensity of the $B_1^+$ field and the intensity of the MR signal using a Bloch equation or a phase image theory, and performing, using the function expression, calculation on T1, T2, TE, TR and the flip angle of the voxel during the first scanning process and the relative intensity of the $B_1^+$ field corresponding to the voxel on the $B_1^+$ field map, to obtain the first residual intensity of the MR signal for the voxel during the first scanning process.

The first pulse sequence is a low-flip-angle gradient recalled echo pulse sequence.

The obtaining a $B_1^-$ field map of the target tissue based on the first MR image and the $B_1^+$ field map includes:

for any voxel of the target tissue, setting a product of a proton density of the voxel and a first residual intensity of an MR signal for the voxel during a first scanning process to be a first constant, where the first residual intensity of the MR signal is a residual intensity of the MR signal for the voxel after impacts of the proton density, a sinusoidal value of a product of a flip angle and an absolute value of a relative intensity of a $B_1^+$ field, and a $B_1^-$ field are removed during the first scanning process, and the first scanning process is a scanning process for obtaining the first MR image; and obtaining an absolute value of an intensity of the $B_1^-$ field for the voxel based on an intensity of an MR signal corresponding to the voxel on the first MR image, the first constant, the flip angle of the voxel during the first scanning process, and the absolute value of the relative intensity of the $B_1^+$ field corresponding to the voxel on the $B_1^+$ field map, where absolute values of intensities of $B_1^-$ fields for all voxels of the target tissue constitute the $B_1^-$ field map of the target tissue.

The first pulse sequence is a low-flip-angle gradient recalled echo pulse sequence.

The obtaining a $B_1^-$ field map of the target tissue based on the first MR image and the $B_1^+$ field map includes:

for any voxel of the target tissue, setting a product of a proton density of the voxel and a first residual intensity of an MR signal for the voxel during a first scanning process to be a first constant, where the first residual intensity of the MR signal is a residual intensity of the MR signal for the voxel after impacts of the proton density, a sinusoidal value of a product of a flip angle and an absolute value of a relative intensity of a $B_1^+$ field, and a $B_1^-$ field are removed during the first scanning process, and the first scanning process is a scanning process for obtaining the first MR image;

obtaining an absolute value of a product of the relative intensity of the $B_1^+$ field for the voxel and an intensity of the $B_1^-$ field for the voxel based on an intensity of an MR signal corresponding to the voxel on the first MR image, the first constant, and the flip angle of the voxel during the first scanning process;

upon obtaining absolute values of products of relative intensities of $B_1^+$ fields for all voxels of the target tissue and intensities of $B_1^-$ fields for all the voxels of the target tissue, fitting the absolute values of the products of the relative intensities of the $B_1^+$ fields for all the voxels of the target tissue and the intensities of the $B_1^-$ fields for all the voxels of the target tissue using a preset three-dimensional spline fitting algorithm, to obtain a three-dimensional spline fitting plot for the absolute values of the products of the relative intensities of the $B_1^+$ fields of the target tissue and the intensities of the $B_1^-$ fields of the target tissue; and for any voxel of the target tissue, dividing a signal intensity corresponding to the voxel on the three-dimensional spline fitting plot by an absolute value of a relative intensity of the $B_1^+$ field corresponding to the voxel on the $B_1^+$ field map, to obtain an absolute value of the intensity of the $B_1^-$ field for the voxel, where absolute values of intensities of $B_1^-$ fields for all voxels of the target tissue constitute the $B_1^-$ field map of the target tissue.

The low-flip-angle gradient recalled echo pulse sequence is a single-echo gradient recalled echo sequence, a multi-echo gradient recalled echo sequence, or an echo planar imaging sequence.

Before obtaining the first magnetic resonance (MR) image, the method further includes:

when a plurality of MR images are obtained after scanning of the target tissue using a low-flip-angle first pulse sequence, selecting, from the plurality of MR images, an image with the lowest tissue contrast as the first MR image.

The performing B1 field inhomogeneity correction on a second MR image of the target tissue based on the $B_1^+$ field map and the B1 field map includes:

for any voxel of the target tissue, obtaining a second residual intensity of an MR signal for the voxel during a second scanning process based on T1 and T2 of the voxel during the second scanning process and a relative intensity of a $B_1^+$ field corresponding to the voxel on the $B_1^+$ field map, where the second residual intensity of the MR signal is a residual intensity of the MR signal for the voxel after impacts of a proton density and a $B_1^-$ field are removed during the second scanning process, and the second scanning process is a scanning process for obtaining the second MR image; and obtaining an intensity of an MR signal corresponding to a voxel, with B1 inhomogeneity correction completed, on the second MR image, based on the intensity of the MR signal corresponding to the voxel on the second MR image, the absolute value of the intensity of the B1 field for the voxel, and the second residual intensity of the MR signal.

The obtaining a second residual intensity of an MR signal for the voxel during a second scanning process based on T1 and T2 of the voxel during the second scanning process and a relative intensity of a $B_1^+$ field corresponding to the voxel on the $B_1^+$ field map includes:

obtaining a function expression between T1, T2 and the relative intensity of the $B_1^+$ field and the intensity of the MR signal using a Bloch equation or a phase image theory, and performing, using the function expression, calculation on T1 and T2 of the voxel during the second scanning process and the relative intensity of the $B_1^+$ field corresponding to the voxel on the $B_1^+$ field map, to obtain the second residual intensity of the MR signal for the voxel during the second scanning process.

There is provided a device for radio-frequency field inhomogeneity correction in magnetic resonance imaging, the device including:
  a first magnetic resonance (MR) image obtaining module configured to obtain a first MR image by scanning a target tissue using a first pulse sequence;
  a transmit radio-frequency $B_1^+$ field map obtaining module configured to obtain a $B_1^+$ field map of the target tissue;
  a receive radio-frequency $B_1^-$ field map obtaining module configured to obtain a $B_1^-$ field map of the target tissue based on the first MR image and the $B_1^+$ field map; and
  a correction module configured to perform B1 field inhomogeneity correction on a second MR image of the target tissue based on the $B_1^+$ field map and the $B_1^-$ field map.

There is provided a magnetic resonance scanner including a device for radio-frequency field inhomogeneity correction in magnetic resonance imaging as described above.

In the aspects of the present disclosure, the first MR image is first obtained by scanning the target tissue using the first pulse sequence, and the $B_1^-$ field map of the target tissue is then obtained based on the first MR image and the $B_1^+$ field map of the target tissue, in such a way that the $B_1^+$ field map and the $B_1^-$ field map of the target tissue are both obtained; next, for any MR image of the same target tissue, B1 field inhomogeneity correction can be performed based on the $B_1^+$ field map and the $B_1^-$ field map of the target tissue. This method can be used to correct B1 field inhomogeneity on an MR image obtained using any imaging protocol or any imaging sequence, and has a remarkable effect on B1 field inhomogeneity correction in MRI systems at an ultra-high field.

BRIEF DESCRIPTION OF THE DRAWINGS

The preferred aspects of the present disclosure will be described in detail hereinafter with reference to the accompanying drawings, to make the above mentioned and other features and advantages of the present disclosure more apparent to those of ordinary skill in the art, in which:

FIG. 2 is a flowchart of a method for B1 field inhomogeneity correction in MRI according to a second aspect of the present disclosure;

FIG. 3 is a flowchart of a method for B1 field inhomogeneity correction in MRI according to a third aspect of the present disclosure;

FIG. 4 is a flowchart of a method for B1 field inhomogeneity correction in MRI according to a fourth aspect of the present disclosure;

LIST OF REFERENCE NUMERALS

| Reference sign | Meaning |
| --- | --- |
| 101-104 | Step |
| 201-210 | Step |
| 301-308 | Step |
| 401-410 | Step |
| 130 | Device for B1 field inhomogeneity correction in MRI |
| 131 | First MR image obtaining module |
| 132 | $B_1^+$ field map obtaining module |
| 133 | $B_1^-$ field map obtaining module |
| 134 | Correction module |

DETAILED DESCRIPTION

In order to make the objectives, technical solutions and advantages of the present disclosure more apparent, the present disclosure will be further described in detail by way of aspects hereinafter.

Figure 1:
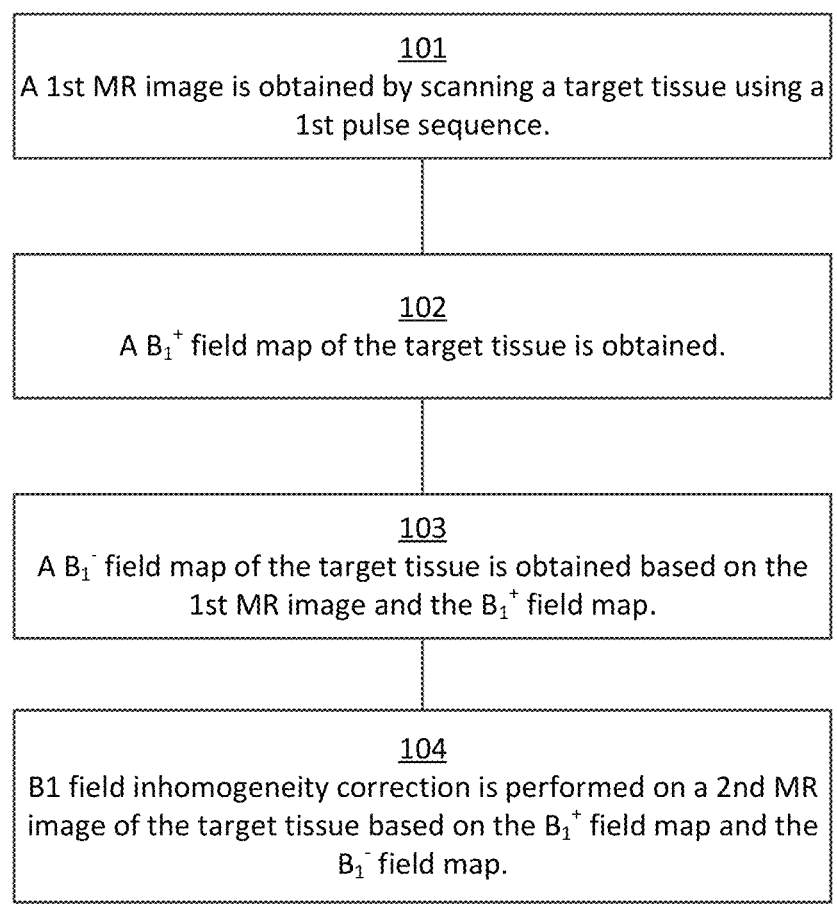
FIG. 1 is a flowchart of a method for B1 field inhomogeneity correction in MRI according to a first aspect of the present disclosure.

FIG. 1 is a flowchart of a method for B1 field inhomogeneity correction in MRI according to a first aspect of the present disclosure. Specific steps of the method are as follows.

In step 101, a first MR image is obtained by scanning a target tissue using a first pulse sequence.

In step 102, a $B_1^+$ field map of the target tissue is obtained. Obtaining the $B_1^+$ field map of the target tissue is a mature technology, which will not be repeated in this aspect.

In step 103, a $B_1^-$ field map of the target tissue is obtained based on the first MR image and the $B_1^+$ field map.

In an optional aspect, this step 103 specifically includes: for any voxel of the target tissue, obtaining a first residual intensity of an MR signal for the voxel during a first scanning process based on T1 (a longitudinal relaxation time), T2 (a transverse relaxation time), TE (an echo time), TR (a repetition time) and a flip angle of the voxel during the first scanning process, and a relative intensity of a $B_1^+$ field corresponding to the voxel on the $B_1^+$ field map; and obtaining an absolute value of an intensity of a $B_1^-$ field for the voxel based on the intensity of the MR signal corresponding to the voxel on the first MR image, a proton density of the voxel, the first residual intensity of the MR signal for the voxel during the first scanning process, the flip angle of the voxel during the first scanning process, and an absolute value of the relative intensity of the $B_1^+$ field corresponding to the voxel on the $B_1^+$ field map, where absolute values of intensities of $B_1^-$ fields for all voxels of the target tissue constitute the $B_1^-$ field map of the target tissue. The first residual intensity of the MR signal is a residual intensity of the MR signal for the voxel after impacts of the proton density, a sinusoidal value of a product of the flip angle and the absolute value of the relative intensity of the $B_1^+$ field, and the $B_1^-$ field are removed during the first scanning process, and the first scanning process is a scanning process for obtaining the first MR image.

In an optional aspect, obtaining an absolute value of an intensity of a $B_1^-$ field for the voxel based on the intensity of the MR signal corresponding to the voxel on the first MR image, a proton density of the voxel, the first residual intensity of the MR signal for the voxel during the first scanning process, the flip angle of the voxel during the first scanning process, and an absolute value of the relative intensity of the $B_1^+$ field corresponding to the voxel on the $B_1^+$ field map includes: multiplying the proton density of the voxel by the first residual intensity of the MR signal for the voxel during the first scanning process, to obtain a first product; multiplying the flip angle of the voxel during the first scanning process by the absolute value of the relative intensity of the $B_1^+$ field corresponding to the voxel on the $B_1^+$ field map, to obtain a second product; obtaining a sinusoidal value of the second product; multiplying the first product by the sinusoidal value of the second product, to obtain a third product; and dividing the intensity of the MR signal corresponding to the voxel on the first MR image by the third product, and then using the obtained quotient value as the absolute value of the intensity of the $B_1^-$ field for the voxel.

In step 104, B1 field inhomogeneity correction is performed on a second MR image of the target tissue based on the $B_1^+$ field map and the $B_1^-$ field map, where the second MR image is an MR image obtained after scanning of the target tissue using any imaging protocol and any pulse sequence.

In an optional aspect, this step 104 specifically includes: for any voxel of the target tissue, obtaining a second residual intensity of an MR signal for the voxel during a second scanning process based on T1 and T2 of the voxel during the second scanning process and a relative intensity of a $B_1^+$ field corresponding to the voxel on the $B_1^+$ field map; and obtaining an intensity of an MR signal corresponding to a voxel, with B1 inhomogeneity correction completed, on the second MR image, based on the intensity of the MR signal corresponding to the voxel on the second MR image, the absolute value of the intensity of the $B_1^-$ field for the voxel, and the second residual intensity of the MR signal. The second residual intensity of the MR signal is a residual intensity of the MR signal for the voxel after impacts of both the proton density and the $B_1^-$ field are removed during the second scanning process, and the second scanning process is a scanning process for obtaining the second MR image.

The beneficial technical effects of the above aspect are as follows: the first MR image is first obtained by scanning the target tissue using the first pulse sequence, and the $B_1^-$ field map of the target tissue is then obtained based on the first MR image and the $B_1^+$ field map of the target tissue, in such a way that the $B_1^+$ field map and the $B_1^-$ field map of the target tissue are both obtained; next, for any MR image of the same target tissue, B1 field inhomogeneity correction can be performed based on the $B_1^+$ field map and the $B_1^-$ field map of the target tissue. This method can be used to correct B1 field inhomogeneity (also referred to as a bias field effect) on any MR image obtained using any imaging protocol or imaging sequence, and has a remarkable effect on B1 field inhomogeneity correction in MRI systems at an ultra-high field.

FIG. 2 is a flowchart of a method for B1 field inhomogeneity correction in MRI according to a second aspect of the present disclosure. Specific steps of the method are as follows.

In step 201, a first MR image is obtained by scanning a target tissue using a first pulse sequence.

In step 202, a $B_1^+$ field map of the target tissue is obtained.

Obtaining the $B_1^+$ field map of the target tissue is a mature technology, which will not be repeated in this aspect.

In step 203, for any voxel of the target tissue, a first residual intensity of an MR signal for the voxel during a first scanning process is obtained based on T1 (a longitudinal relaxation time), T2 (a transverse relaxation time), TE (an echo time), TR (a repetition time) and a flip angle of the voxel during the first scanning process, and a relative intensity of a $B_1^+$ field corresponding to the voxel on the $B_1^+$ field map. The first residual intensity of the MR signal for the voxel during the first scanning process is a residual intensity of the MR signal for the voxel after impacts of the proton density, a sinusoidal value of a product of the flip angle and the absolute value of the relative intensity of the $B_1^+$ field, and the $B_1^-$ field are removed during the first scanning process, and the first scanning process is a scanning process for obtaining the first MR image.

In other words, it is considered in this step that the intensity of the MR signal is affected by the following three factors: I. the proton density; II. the sinusoidal value of the product of the flip angle and the absolute value of the relative intensity of the $B_1^+$ field; III. the $B_1^-$ field; and IV. factors other than I, II and III.

In practical application, a function expression between T1, T2, TE, TR, the flip angle and the relative intensity of the $B_1^+$ field and the intensity of the MR signal may be obtained using a Bloch equation or a phase image theory, and calculation is performed, using the function expression, on T1, T2, TE, TR and the flip angle of the voxel during the first scanning process and the relative intensity of the $B_1^+$ field corresponding to the voxel on the $B_1^+$ field map, to obtain the first residual intensity of the MR signal for the voxel during the first scanning process.

For example, for any voxel r of the target tissue, a first residual intensity of an MR signal for the voxel during the first scanning process can be expressed as:

$$f(T1(r), T2(r), TE, TR, \alpha \cdot |B_1^+(r)|)$$

where T1(r) is T1 of the voxel r, T2(r) is T2 of the voxel r, $\alpha$ is a set flip angle, $B_1^+(r)$ is a relative intensity of a $B_1^+$ field for the voxel r (when an actual flip angle of the voxel r is the same as the set flip angle, $|B_1^+(r)|=1$), TE is the echo time, and TR is the repetition time. The expression $f(T1(r), T2(r), TE, TR, \alpha \cdot |B_1^+(r)|)$ can be obtained using the Bloch equation or the phase image theory.

Additionally, since T1(r) and T2(r) of each voxel are obtained by means of scanning using a specific sequence, the values of T1(r) and T2(r) may be empirical constants.

In step 204, the proton density of the voxel is multiplied by the first residual intensity of the MR signal for the voxel during the first scanning process, to obtain a first product.

For example, the first product is $M_0(r) \cdot f(T1(r), T2(r), TE, TR, \alpha \cdot |B_1^+(r)|)$, where $M_0(r)$ is a proton density of the voxel r.

In step 205, the flip angle of the voxel during the first scanning process is multiplied by the absolute value of the relative intensity of the $B_1^+$ field corresponding to the voxel on the $B_1^+$ field map, to obtain a second product, and a sinusoidal value of the second product is obtained.

For example, the second product is $\alpha \cdot |B_1^+(r)|$.

In step 206, the first product is multiplied by the sinusoidal value of the second product, to obtain a third product.

For example, the third product is $M_0(r) \cdot f(T1(r), T2(r), TE, TR, \alpha \cdot |B_1^+(r)|) \cdot \sin(\alpha \cdot |B_1^+(r)|)$.

In step 207, an intensity of an MR signal corresponding to the voxel on the first MR image is divided by the third product, and the obtained quotient value is then used as the absolute value of the intensity of the $B_1^-$ field for the voxel.

For example, $$|B_1^-(r)| = S(r)/(M_0(r) \cdot \sin(\alpha \cdot |B_1^+(r)|) \cdot f(T1(r), T2(r), TE, TR, \alpha \cdot |B_1^+(r)|))$$

where $B_1^-(r)$ is an intensity of a $B_1^-$ field for a voxel r, and S(r) is an intensity of an MR signal corresponding to the voxel r on the first MR image.

Once an absolute value of an intensity of a $B_1^-$ field for each voxel of the target tissue is obtained, a $B_1^-$ field map of the target tissue is obtained.

For any voxel of the target tissue, there is:

$$S(r) = M_0(r) \cdot \sin(\alpha \cdot |B_1^+(r)|) \cdot f(T1(r), T2(r), TE, TR, \alpha \cdot |B_1^+(r)|)$$

where r represents any voxel of the target tissue, S(r) is an MR signal intensity for the voxel r, $M_0(r)$ is a proton density of the voxel r, $\alpha$ is a set flip angle, $B_1^+(r)$ is a relative intensity of a $B_1^+$ field for the voxel r, $B_1^-(r)$ is an intensity of a $B_1^-$ field for the voxel r, T1 (r) is T1 of the voxel r, T2(r) is T2 of the voxel r, TE is an echo time, TR is a repetition time, and $f(T1(r), T2(r), TE, TR, \alpha \cdot |B_1^+(r)|)$ is a first residual intensity of an MR signal for the voxel r.

Then, $|B_1^-(r)| = S(r)/(M_0(r) \cdot \sin(\alpha \cdot |B_1^+(r)|) \cdot f(T1(r), T2(r), TE, TR, \alpha \cdot |B_1^+(r)|))$.

In step 208, for any voxel of the target tissue, a second residual intensity of an MR signal for the voxel during a second scanning process is obtained based on T1 and T2 of the voxel during the second scanning process and a relative intensity of a $B_1^+$ field corresponding to the voxel on the $B_1^+$ field map. The second residual intensity of the MR signal for the voxel during the second scanning process is a residual intensity of the MR signal for the voxel after impacts of both the proton density and the B1 field are removed during the second scanning process, and the second scanning process is a scanning process for obtaining the second MR image.

In practical application, a function expression between T1, T2 and the relative intensity of the $B_1^+$ field and the intensity of the MR signal is obtained using the Bloch equation or the phase image theory, and calculation is performed, using the function expression, on T1 and T2 of the voxel during the second scanning process and the relative intensity of the $B_1^+$ field corresponding to the voxel on the $B_1^+$ field map, to obtain the second residual intensity of the MR signal for the voxel during the second scanning process.

For example, for any voxel r of the target tissue, a second residual intensity of an MR signal for the voxel during the second scanning process can be expressed as:

$$g(T1(r), T2(r), |B_1^+(r)|)$$

where T1(r) is T1 of the voxel r, T2(r) is T2 of the voxel r, and $B_1^+(r)$ is a relative intensity of a $B_1^+$ field for the voxel r. The expression $g(T1(r), T2(r), |B_1^+(r)|)$ can be obtained using the Bloch equation or the phase image theory.

If the target tissue is scanned in a manner of parallel transmission, then for any voxel r of the target tissue, a second residual intensity of an MR signal for the voxel during the second scanning process can be expressed as:

$$g(T1(r), T2(r), B_{1,1}^+(r), B_{1,2}^+(r), B_{1,3}^+(r), \ldots, B_{1,n-1}^+(r), B_{1,n}^+(r))$$

where n is a total number of transmission channels, and $B_{1,k}^+(r)$ is a relative intensity of the $B_1^+$ field for the voxel r in a transmission channel k, with $1 \leq k \leq n$.

In step 209, the absolute value of the intensity of the $B_1^-$ field for the voxel is multiplied by the second residual intensity of the MR signal for the voxel during the second scanning process, to obtain a fifth product.

For example, the fifth product is $$|B_1^-(r)| \cdot g(T1(r), T2(r), |B_1^+(r)|)$$

where $B_1^-(r)$ is an intensity of a $B_1^-$ field for a voxel r.

In step 210, an intensity of an MR signal corresponding to the voxel on a second MR image is divided by the fifth product, and the obtained quotient value is then used as an intensity of an MR signal corresponding to the voxel, with B1 inhomogeneity correction completed, on the second MR image.

For example, $$I_{cor}(r) = I(r)/(|B_1^-(r)| \cdot g(T1(r), T2(r), |B_1^+(r)|)) \qquad (1)$$

where I(r) is an intensity of an MR signal corresponding to the voxel r on the second MR image, and $I_{cor}(r)$ is an intensity of an MR signal corresponding to the voxel r, with B1 inhomogeneity correction completed, on the second MR image.

It is to be noted that the values of T1(r) and T2(r) in the foregoing formula are empirical constant values.

Once the correction of B1 field inhomogeneity in an intensity of an MR signal corresponding to each voxel of the target tissue on the second MR image has been completed, a second MR image with B1 field inhomogeneity correction completed is obtained.

Formula (1) is obtained by the following process.

For the second MR image, for any voxel r of the target tissue, there is:

$$I(r) = |B_1^-(r)| \cdot g(T1(r), T2(r), |B_1^+(r)|) \cdot M_0(r)$$

when no B1 field inhomogeneity exists, $|B_1^+(r)| = 1$, and therefore, $$I_{cor}(r) = (I(r)/|B_1^-(r)|)(g(T1(r), T2(r), 1)/g(T1(r), T2(r), |B_1^+(r)|)).$$

In many situations, a T1 map and a T2 map are not available, in which case T1(r) and T2(r) are usually replaced with empirical constant values of T1 and T2, and since only a relative value needs to be considered for $I_{cor}(r)$, $g(T1(r), T2(r), 1)$ may be replaced by a constant, which may be, most simply, 1, such that:

$$I_{cor}(r) = (I(r)/|B_1^-(r)|) \cdot (1/g(T1(r), T2(r), |B_1^+(r)|)) = I(r)/(|B_1^-(r)| \cdot g(T1(r), T2(r), |B_1^+(r)|)).$$

As such, formula (1) is obtained.

In an optional aspect, the first pulse sequence in step 101 is a low-flip-angle gradient recalled echo pulse sequence.

Step 103 specifically includes: for any voxel of the target tissue, setting a product of the proton density of the voxel and the first residual intensity of the MR signal for the voxel during the first scanning process to be a first constant; and obtaining the absolute value of the intensity of the $B_1^-$ field for the voxel based on the intensity of the MR signal corresponding to the voxel on the first MR image, the first constant, the flip angle of the voxel during the first scanning process, and the absolute value of the relative intensity of the $B_1^+$ field corresponding to the voxel on the $B_1^+$ field map, where absolute values of intensities of $B_1^-$ fields for all voxels of the target tissue constitute the field map of the target tissue. The first residual intensity of the MR signal is a residual intensity of the MR signal for the voxel after impacts of the proton density, a sinusoidal value of a product of the flip angle and the absolute value of the relative intensity of the $B_1^+$ field, and the $B_1^-$ field are removed during the first scanning process, and the first scanning process is a scanning process for obtaining the first MR image.

FIG. 3 is a flowchart of a method for B1 field inhomogeneity correction in MRI according to a third aspect of the present disclosure. Specific steps of the method are as follows.

In step 301, a first MR image is obtained by scanning a target tissue using a low-flip-angle gradient recalled echo pulse sequence.

In this step, the low-flip-angle gradient recalled echo pulse sequence is used to scan the target tissue, for the purpose of obtaining the first MR image with low tissue contrast. The low-flip-angle gradient recalled echo pulse sequence is, for example: a single-echo gradient recalled echo (GRE) sequence, a multi-echo GRE sequence, an echo planar imaging (EPI) sequence, etc. The magnitude of the low flip angle may be specifically determined depending on a pulse sequence used. For example, a low flip angle of 5° may be used for a GRE sequence. Generally, the low flip angle in this aspect refers to a flip angle not greater than 10°. In practical application, the tissue contrast may be reduced by adjusting TE, TR and/or the flip angle.

In step 302, a $B_1^+$ field map of the target tissue is obtained.

In step 303, for any voxel of the target tissue, a product of a proton density of the voxel and a first residual intensity of an MR signal for the voxel during a first scanning process is set to a first constant. The first residual intensity of the MR signal for the voxel during the first scanning process is a residual intensity of the MR signal for the voxel after impacts of the proton density, a sinusoidal value of a product of the flip angle and the absolute value of the relative intensity of the $B_1^+$ field, and the $B_1^-$ field on the intensity of the MR signal are removed during the first scanning process, and the first scanning process is a scanning process for obtaining the first MR image.

The tissue contrast of the first MR image is kept as low as possible by selecting scanning parameters. Therefore, for any voxel of the target tissue, the product of the proton density of the voxel and the first residual intensity of the MR signal for the voxel during the first scanning process is close to a constant. Here, the constant is set to a first constant. It is to be noted that the specific value of the first constant is not important, since the intensity of the $B_1^-$ field of each voxel in the $B_1^-$ field map of the target tissue is essentially a relative value relative to the intensity of the $B_1^-$ fields for other voxels. In practical application, for convenience of calculation, the value of the first constant may be directly set to 1.

In other words, for any voxel r of the target tissue, set $M_0(r) \cdot f(T1(r), T2(r), TE, TR, \alpha \cdot |B_1^+(r)|) \approx$ constant, and generally set $M_0(r) \cdot f(T1(r), T2(r), TE, TR, \alpha \cdot |B_1^+(r)|) \approx 1$. Then, in this step, $M_0(r) \cdot f(T1(r), T2(r), TE, TR, \alpha \cdot |B_1^+(r)|) = 1$ where $M_0(r)$ is a proton density of the voxel r, T1(r) is T1 of the voxel r, T2(r) is T2 of the voxel r, TE is an echo time, TR is a repetition time, $\alpha$ is a set flip angle, $B_1^+(r)$ is a relative intensity of a $B_1^+$ field for the voxel r, and $f(T1(r), T2(r), TE, TR, \alpha \cdot |B_1^+(r)|)$ is a first residual intensity of an MR signal for the voxel r.

In step 304, the first constant, the flip angle of the voxel during the first scanning process, and the absolute value of the relative intensity of the $B_1^+$ field corresponding to the voxel on the $B_1^+$ field map are multiplied to obtain a fourth product.

Since a low flip angle is used, $\sin(\alpha \cdot |B_1^+(r)|) \approx \alpha \cdot |B_1^+(r)|$, and then, the formula is $S(r) = M_0(r) \cdot \sin(\alpha \cdot |B_1^+(r)|) \cdot |B1(r)| \cdot f(T1(r), T2(r), TE, TR, \alpha \cdot |B_1^+(r)|) \approx \alpha \cdot |B_1^+(r)| \cdot |B_1^-(r)|$, where r represents any voxel of the target tissue, S(r) is an MR signal intensity for the voxel r, $M_0(r)$ is a proton density of the voxel r, $\alpha$ is a set flip angle, $B_1^+(r)$ is a relative intensity of a $B_1^+$ field for the voxel r, $B_1^-(r)$ is an intensity of a $B_1^-$ field for the voxel r, T1(r) is T1 of the voxel r, T2(r) is T2 of the voxel r, TE is an echo time, TR is a repetition time, and f is a first residual intensity of an MR signal for the voxel r.

In step 305, the intensity of the MR signal corresponding to the voxel on the first MR image is divided by the fourth product, and the obtained quotient value is then used as the absolute value of the intensity of the $B_1^-$ field for the voxel.

In other words, when the first constant is set to 1, $|B_1^-(r)| = S(r)/(\alpha \cdot |B_1^+(r)|)$.

Once an absolute value of an intensity of a $B_1^-$ field for each voxel of the target tissue is obtained, a $B_1^-$ field map of the target tissue is obtained.

In step 306, for any voxel of the target tissue, a second residual intensity of an MR signal for the voxel during a second scanning process is obtained based on T1 and T2 of the voxel during the second scanning process and a relative intensity of a $B_1^+$ field corresponding to the voxel on the $B_1^+$ field map. The second residual intensity of the MR signal for the voxel during the second scanning process is a residual intensity of the MR signal for the voxel after impacts of both the proton density and the $B_1^-$ field are removed during the second scanning process, and the second scanning process is a scanning process for obtaining the second MR image.

In practical application, a function expression between T1, T2 and the relative intensity of the $B_1^+$ field and the intensity of the MR signal is obtained using the Bloch equation or the phase image theory, and calculation is performed, using the function expression, on T1 and T2 of the voxel during the second scanning process and the relative intensity of the $B_1^+$ field corresponding to the voxel on the $B_1^+$ field map, to obtain the second residual intensity of the MR signal for the voxel during the second scanning process.

For example, for any voxel r of the target tissue, a second residual intensity of an MR signal for the voxel during the second scanning process can be expressed as: $g(T1(r), T2(r), |B_1^+(r)|)$ where T1(r) is T1 of the voxel r, T2(r) is T2 of the voxel r, and $B_1^+(r)$ is a relative intensity of a $B_1^+$ field for the voxel r. The expression $g(T1(r), T2(r), |B_1^+(r)|)$ can be obtained using the Bloch equation or the phase image theory.

If the target tissue is scanned in a manner of parallel transmission, then for any voxel r of the target tissue, a second residual intensity of an MR signal for the voxel during the second scanning process can be expressed as:

$$g(T1(r), T2(r), B_{1,1}^+(r), B_{1,2}^+(r), B_{1,3}^+(r), \ldots, B_{1,n-1}^+(r), B_{1,n}^+(r))$$

where n is a total number of transmission channels, and $B_{1,k}^+(r)$ is a relative intensity of the $B_1^+$ field for the voxel r in a transmission channel k, with $1 \leq k \leq n$.

In step 307, the absolute value of the intensity of the $B_1^-$ field for the voxel is multiplied by the second residual intensity of the MR signal for the voxel during the second scanning process, to obtain a fifth product.

For example, the fifth product is $$|B_1^-(r)| \cdot g(T1(r), T2(r), |B_1^+(r)|)$$

where $B_1^-(r)$ is an intensity of a $B_1^-$ field for a voxel r.

In step 308, an intensity of an MR signal corresponding to the voxel on a second MR image is divided by the fifth product, and the obtained quotient value is then used as an intensity of an MR signal corresponding to the voxel, with B1 inhomogeneity correction completed, on the second MR image.

For example, $$I_{cor}(r) = I(r) / (|B_1^-(r)| g(T1(r), T2(r), |B_1^+(r)|))$$

where I(r) is an intensity of an MR signal corresponding to the voxel r on the second MR image, and $I_{cor}(r)$ is an intensity of an MR signal corresponding to the voxel r, with B1 inhomogeneity correction completed, on the second MR image.

It is to be noted that in practical application, the values of T1(r) and T2(r) in the foregoing formulas are empirical constant values.

Once the correction of B1 field inhomogeneity in an intensity of an MR signal corresponding to each voxel of the target tissue on the second MR image has been completed, a second MR image with B1 field inhomogeneity correction completed is obtained.

It is to be noted that in most situations, no additional scanning process is required to obtain the first MR image. For example, to obtain the $B_1^+$ field map, a pre-saturated Turbo Flash (TFL) sequence is usually used for scanning, and an MR image obtained in this case has a relatively low tissue contrast and can then be used as the first MR image. Alternatively, during normal imaging scanning of the target tissue, if the low-flip-angle gradient recalled echo pulse sequence is exactly used, an MR image obtained in this case can be directly used as the first MR image; and if a plurality of MR images is obtained at the same time, an MR image with the lowest tissue contrast is then selected as the first MR image.

In an optional aspect, the first pulse sequence in step 101 is a low-flip-angle gradient recalled echo pulse sequence.

Step 103 specifically includes: for any voxel of the target tissue, setting a product of the proton density of the voxel and the first residual intensity of the MR signal for the voxel during the first scanning process to be a first constant; obtaining an absolute value of a product of the relative intensity of the $B_1^+$ field for the voxel and an intensity of the $B_1^-$ field for the voxel based on an intensity of an MR signal corresponding to the voxel on the first MR image, the first constant, and the flip angle of the voxel during the first scanning process; upon obtaining absolute values of products of relative intensities of $B_1^+$ fields for all voxels of the target tissue and intensities of $B_1^-$ fields for all the voxels of the target tissue, fitting the absolute values of the products of the relative intensities of the $B_1^+$ fields for all the voxels of the target tissue and the intensities of the $B_1^-$ fields for all the voxels of the target tissue using a preset three-dimensional spline fitting algorithm, to obtain a three-dimensional spline fitting plot for the absolute values of the products of the relative intensities of the $B_1^+$ fields of the target tissue and the intensities of the $B_1^-$ fields of the target tissue; and for any voxel of the target tissue, dividing a signal intensity corresponding to the voxel on the three-dimensional spline fitting plot by the absolute value of the relative intensity of the $B_1^+$ field corresponding to the voxel on the $B_1^+$ field map, to obtain the absolute value of the intensity of the $B_1^-$ field for the voxel, where absolute values of the intensities of the $B_1^-$ fields for all the voxels of the target tissue constitute the $B_1^-$ field map of the target tissue. The first residual intensity of the MR signal is a residual intensity of the MR signal for the voxel after impacts of the proton density, a sinusoidal value of a product of the flip angle and the absolute value of the relative intensity of the $B_1^+$ field, and the $B_1^-$ field are removed during the first scanning process, and the first scanning process is a scanning process for obtaining the first MR image.

FIG. 4 is a flowchart of a method for B1 field inhomogeneity correction in MRI according to a fourth aspect of the present disclosure. Specific steps of the method are as follows.

In step 401, a first MR image is obtained by scanning a target tissue using a low-flip-angle gradient recalled echo pulse sequence.

In this step, the low-flip-angle gradient recalled echo pulse sequence is used to scan the target tissue, for the purpose of obtaining the first MR image with low contrast. The low-flip-angle gradient recalled echo pulse sequence is, for example, a single-echo GRE sequence, a multi-echo GRE sequence, an EPI sequence, etc. The magnitude of the low flip angle may be specifically determined depending on a pulse sequence used. For example, a low flip angle of 5° may be used for a GRE sequence. Generally, the low flip angle in this aspect refers to a flip angle not greater than 10°. In practical application, the tissue contrast may be reduced by adjusting TE, TR and/or the flip angle.

In step 402, a $B_1^+$ field map of the target tissue is obtained.

In step 403, for any voxel of the target tissue, a product of a proton density of the voxel and a first residual intensity of an MR signal for the voxel during a first scanning process is set to a first constant. The first residual intensity of the MR signal for the voxel during the first scanning process is a residual intensity of the MR signal for the voxel after impacts of the proton density, a sinusoidal value of a product of the flip angle and the absolute value of the relative intensity of the $B_1^+$ field, and the $B_1^-$ field are removed during the first scanning process, and the first scanning process is a scanning process for obtaining the first MR image.

The tissue contrast of the first MR image is kept as low as possible by selecting scanning parameters. Therefore, for any voxel of the target tissue, the product of the proton density of the voxel and the first residual intensity of the MR signal for the voxel during the first scanning process is close to a constant. Here, the constant is set to a first constant. It is to be noted that the specific value of the first constant is not important, since the intensity of the $B_1^-$ field of each voxel in the $B_1^-$ field map of the target tissue is essentially a relative value relative to the intensity of the $B_1^-$ fields for other voxels. In practical application, for convenience of calculation, the value of the first constant may be directly set to 1.

In other words, for any voxel r of the target tissue, set $M_0(r) \cdot f(T1(r),T2(r),TE,TR,\alpha \cdot |B_1^+(r)|) \approx$ constant, and generally set $M_0(r) \cdot f(T1(r),T2(r),TE,TR,\alpha \cdot |B_1^+(r)|) \approx 1$. Then, in this step, $M_0(r) \cdot f(T1(r),T2(r),TE,TR,\alpha \cdot |B_1^+(r)|)=1$ where $M_0(r)$ is a proton density of the voxel r, T1(r) is T1 of the voxel r, T2(r) is T2 of the voxel r, TE is an echo time, TR is a repetition time, $\alpha$ is a set flip angle, $B_1^+(r)$ is a relative intensity of a $B_1^+$ field for the voxel r, and $f(T1(r),T2(r),TE,TR,\alpha \cdot |B_1^+(r)|)$ is a first residual intensity of an MR signal for the voxel r.

In step 404, the first constant is multiplied by the flip angle of the voxel during the first scanning process, to obtain a second constant.

If the first constant is 1, the second constant is the flip angle $\alpha$.

In step 405, the intensity of the MR signal corresponding to the voxel on the first MR image is divided by the second constant, and the obtained quotient value is then used as an absolute value of a product of the relative intensity of the $B_1^+$ field for the voxel and the intensity of the $B_1^-$ field for the voxel.

In other words, if the second constant is the flip angle $\alpha$, then $B_1^{\pm}(r)=|B_1^-(r)| \cdot |B_1^+(r)|=S(r)/\alpha$ where S(r) is an intensity of an MR signal corresponding to the voxel r on the first MR image.

In step 406, upon obtaining absolute values of products of relative intensities of $B_1^+$ fields for all voxels of the target tissue and intensities of $B_1^-$ fields for all the voxels of the target tissue, the absolute values of the products of the relative intensities of the $B_1^+$ fields for all the voxels of the target tissue and the intensities of the $B_1^-$ fields for all the voxels of the target tissue are fitted using a preset three-dimensional spline fitting algorithm, to obtain a three-dimensional spline fitting plot for the absolute values of the products of the relative intensities of the $B_1^+$ fields of the target tissue and the intensities of the $B_1^-$ fields of the target tissue.

The three-dimensional spline fitting algorithm is a mature technology, and in the aspects of the present disclosure, multi-resolution control points can be used during $B_1^{\pm}(r)$ three-dimensional spline fitting. For example, the spacing between adjacent control points can be any two or three of 22 mm (millimeters), 44 mm, and 88 mm.

In step 407, for any voxel of the target tissue, a signal intensity corresponding to the voxel on the three-dimensional spline fitting plot is divided by the absolute value of the relative intensity of the $B_1^+$ field corresponding to the voxel on the $B_1^+$ field map, to obtain an absolute value of the intensity of the $B_1^-$ field for the voxel.

That is, $$|B_1^-(r)|=B_{1s}^{\pm}(r)/B_1^+(r)|$$

where $B_1^-(r)$ is an intensity of a $B_1^-$ field of the voxel r, and $B_{1s}^{\pm}(r)$ is a signal intensity corresponding to the voxel r on the three-dimensional spline fitting plot.

Once an absolute value of an intensity of a $B_1^-$ field for each voxel of the target tissue is obtained, a $B_1^-$ field map of the target tissue is obtained.

In step 408, for any voxel of the target tissue, a second residual intensity of an MR signal for the voxel during a second scanning process is obtained based on T1 and T2 of the voxel during the second scanning process and a relative intensity of a $B_1^+$ field corresponding to the voxel on the $B_1^+$ field map. The second residual intensity of the MR signal for the voxel during the second scanning process is a residual intensity of the MR signal for the voxel after impacts of both the proton density and the $B_1^-$ field are removed during the second scanning process, and the second scanning process is a scanning process for obtaining the second MR image.

In practical application, a function expression between T1, T2 and the relative intensity of the $B_1^+$ field and the intensity of the MR signal is obtained using the Bloch equation or the phase image theory, and calculation is performed, using the function expression, on T1 and T2 of the voxel during the second scanning process and the relative intensity of the $B_1^+$ field corresponding to the voxel on the $B_1^+$ field map, to obtain the second residual intensity of the MR signal for the voxel during the second scanning process.

For example, for any voxel r of the target tissue, a second residual intensity of an MR signal for the voxel during the second scanning process can be expressed as:

$$g(T1(r),T2(r),|B_1^+(r)|)$$

where T1(r) is T1 of the voxel r, T2(r) is T2 of the voxel r, and $B_1^+(r)$ is a relative intensity of a $B_1^+$ field for the voxel r. The expression $g(T1(r),T2(r),|B_1^+(r)|)$ can be obtained using the Bloch equation or the phase image theory.

If the target tissue is scanned in a manner of parallel transmission, then for any voxel r of the target tissue, a second residual intensity of an MR signal for the voxel during the second scanning process can be expressed as:

$$g(T1(r),T2(r),B_{1,1}^+(r),B_{1,2}^+(r),B_{1,3}^+(r),\ldots,B_{1,n-1}^+(r),B_{1,n}^+(r))$$

where n is a total number of transmission channels, and $B_{1,k}^+(r)$ is a relative intensity of the $B_1^+$ field for the voxel r in a transmission channel k, with $1 \le k \le n$.

In step 409, the absolute value of the intensity of the $B_1^-$ field for the voxel is multiplied by the second residual intensity of the MR signal for the voxel during the second scanning process, to obtain a fifth product.

For example, the fifth product is $$|B_1^-(r)| \cdot g(T1(r),T2(r),|B_1^+(r)|)$$

where $B_1^-(r)$ is an intensity of a $B_1^-$ field for a voxel r.

In step 410, an intensity of an MR signal corresponding to the voxel on a second MR image is divided by the fifth product, and the obtained quotient value is then used as an intensity of an MR signal corresponding to the voxel, with B1 inhomogeneity correction completed, on the second MR image.

For example, $$I_{cor}(r)=I(r)/(|B_1^-(r)| \cdot g(T1(r),T2(r),|B_1^+(r)|))$$

where I(r) is an intensity of an MR signal corresponding to the voxel r on the second MR image, and $I_{cor}(r)$ is an intensity of an MR signal corresponding to the voxel r, with B1 inhomogeneity correction completed, on the second MR image.

It is to be noted that in practical application, the values of T1(r) and T2(r) in the foregoing formulas are empirical constant values.

Once the correction of B1 field inhomogeneity in an intensity of an MR signal corresponding to each voxel of the target tissue on the second MR image has been completed, a second MR image with B1 field inhomogeneity correction completed is obtained.

In the above second to fourth aspects, the correction method is more stable due to the introduction of the estimation of the $B_1^-$ field map and the correction of B1 field inhomogeneity through physical calculation, without relying on an image model, thereby further optimizing the effect of B1 field inhomogeneity correction in MRI.

Figure 5:
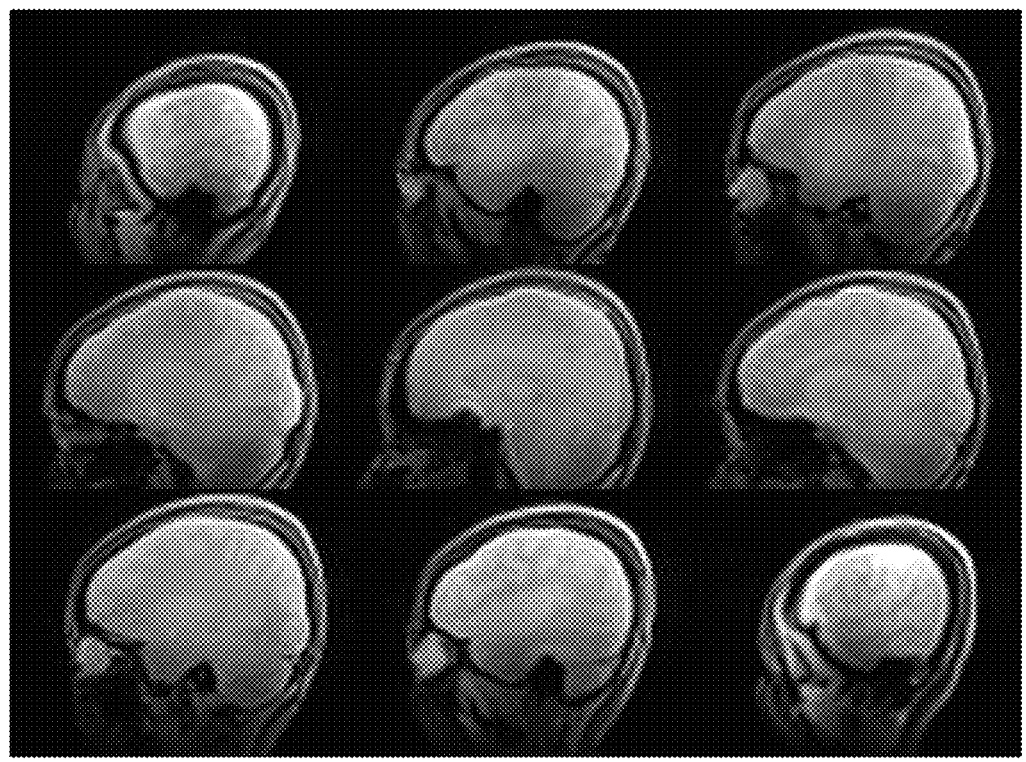
FIG. 5 is a schematic diagram of 9 slices of a PD weighted image obtained by performing MR scanning on a target brain tissue of a healthy volunteer using an SPGR sequence in an application example of the present disclosure.

Experimental results of the aspects of the present disclosure are given below, and the experiment is carried out on a 7 T MRI system:

FIG. 5 shows 9 slices of a proton density (PD) weighted image obtained by performing MR scanning on a target brain tissue of a healthy volunteer using a spoiled gradient recalled echo (SPGR) sequence. Imaging parameters are: TE=2.41 ms (milliseconds), TR=20 ms, flip angle=5°, FOV (Field of View)=220 mm (millimeters)×220 mm×220 mm, and imaging matrix=80×80×80.

Figure 6:
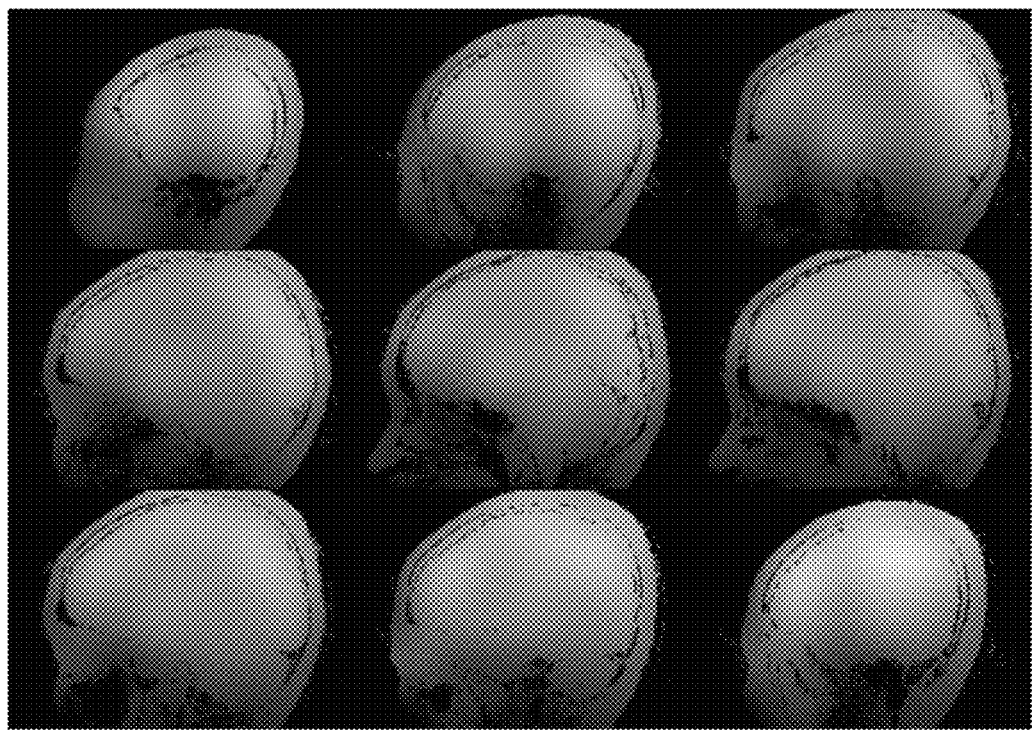
FIG. 6 is a schematic diagram of 9 slices of a $B_{1s}^\pm$ field map obtained based on the PD weighted image of FIG. 5 using the fourth aspect of the present disclosure.

FIG. 6 shows 9 slices of a $B_{1s}^{\pm}$ field map obtained based on the PD weighted image of FIG. 5 using the fourth aspect of the present disclosure. The $B_{1s}^{\pm}$ field map refers to a three-dimensional spline fitting plot obtained after three-dimensional spline fitting of the $B_1^{\pm}$ field map.

Figure 7:
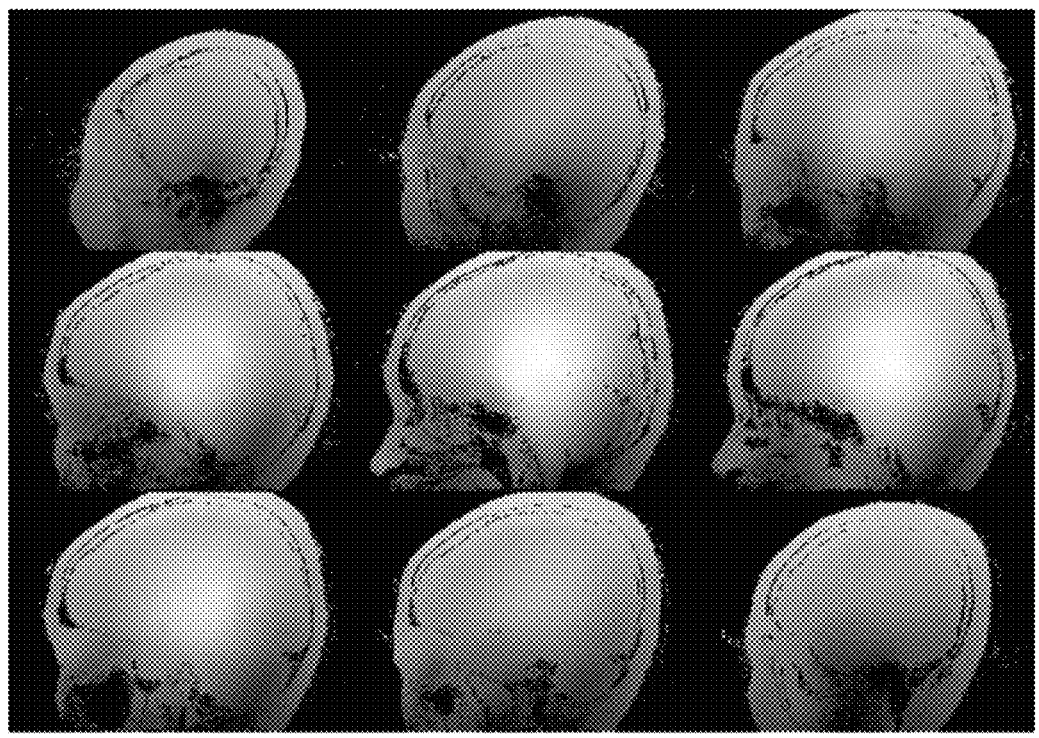
FIG. 7 is a schematic diagram of 9 slices of a $|B_1^+|$ field map of a target brain tissue that is obtained using a pre-saturated TFL sequence in an application example of the present disclosure.

FIG. 7 shows 9 slices of a $|B_1^{+}|$ field map of a target brain tissue that is obtained using a pre-saturated TFL sequence, in which the positions of the slices are the same as those in FIG. 6. Imaging parameters are: FOV=220 mm×220 mm×220 mm, and imaging matrix=64×64×30.

Figure 8:
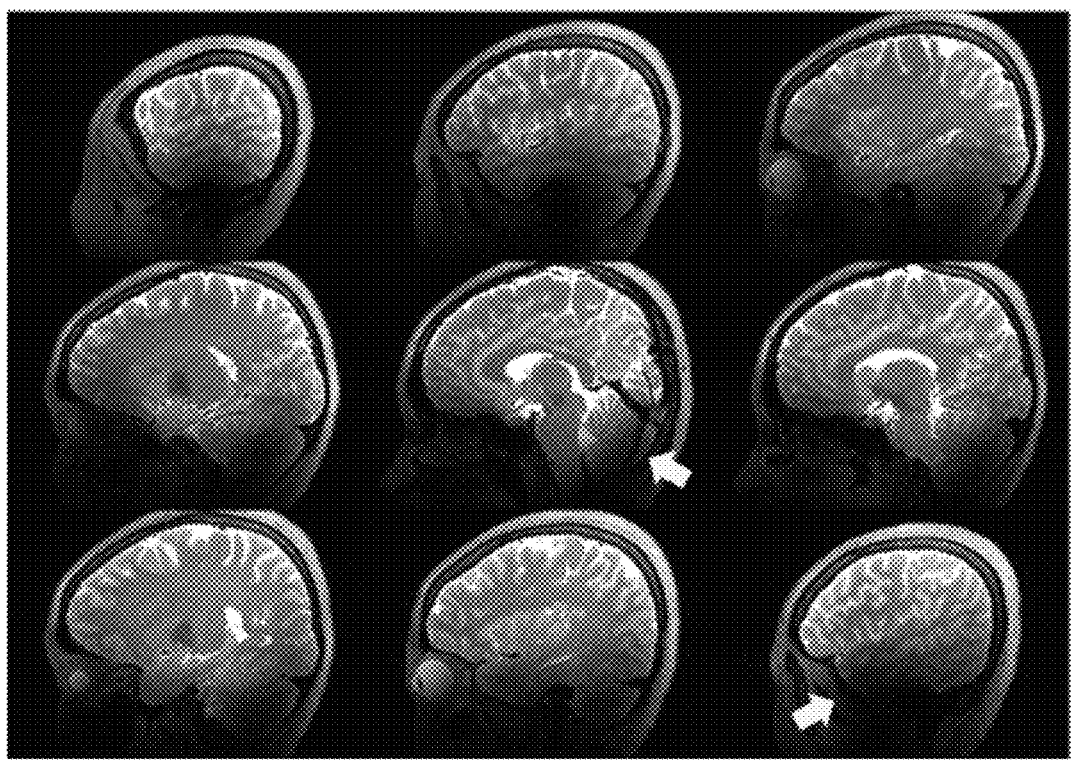
FIG. 8 is a schematic diagram of 9 slices of a T2 weighted image obtained by performing MR scanning on a target brain tissue using a 3D-SPACE sequence in an application example of the present disclosure.

FIG. 8 shows 9 slices of a T2 weighted image obtained by performing MR scanning on a target brain tissue using a 3D Sampling Perfection with Application optimized Contrasts using different flip angle Evolution (3D-SPACE) sequence. Imaging parameters are: TE/TR=118/4000, ETL (Echo Train Length)=119, FOV=212 mm×150 mm×170 mm, and imaging matrix=318×224×256.

Figure 9:
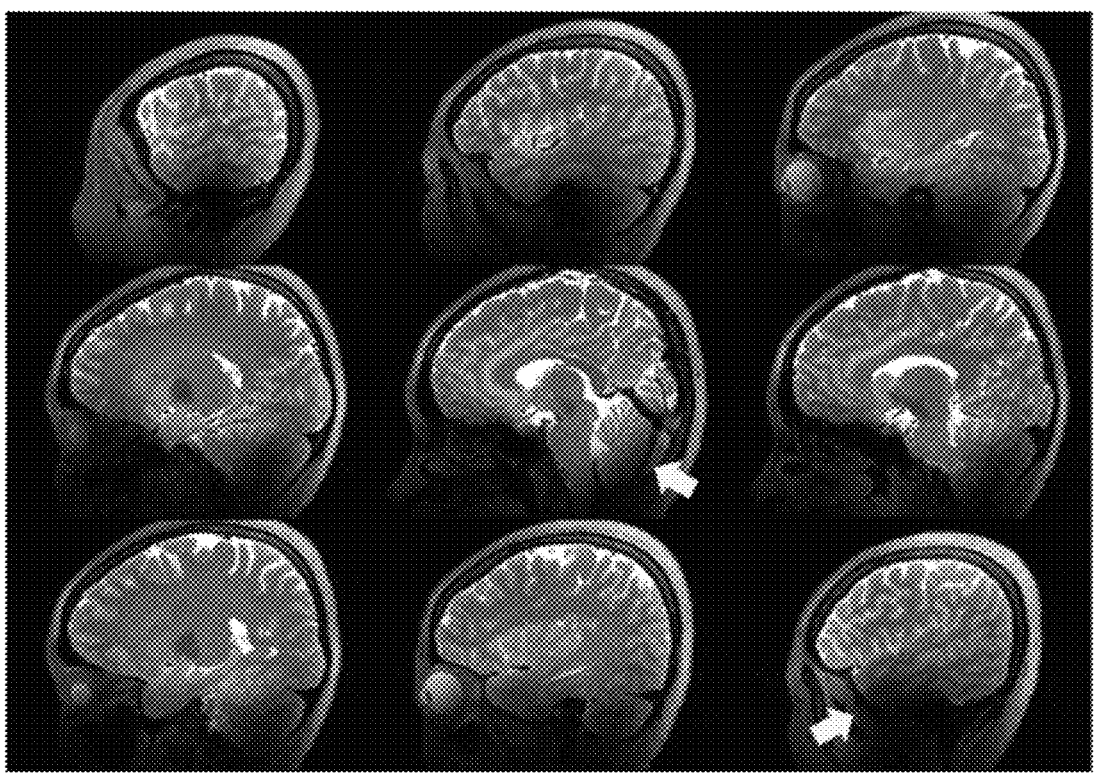
FIG. 9 is a schematic diagram of an image obtained after correcting FIG. 8 using an existing N4ITK method.

FIG. 9 shows an image obtained after correcting FIG. 8 using an existing N4ITK method, in which the positions of the 9 slices are the same as those in FIG. 8. It can be seen from the 9 slices of FIG. 9 that the non-uniformity of signals is reduced in most regions of the brain, whereas the non-uniformity of signals is not reduced in regions with a low field intensity of the B1 field.

Figure 10:
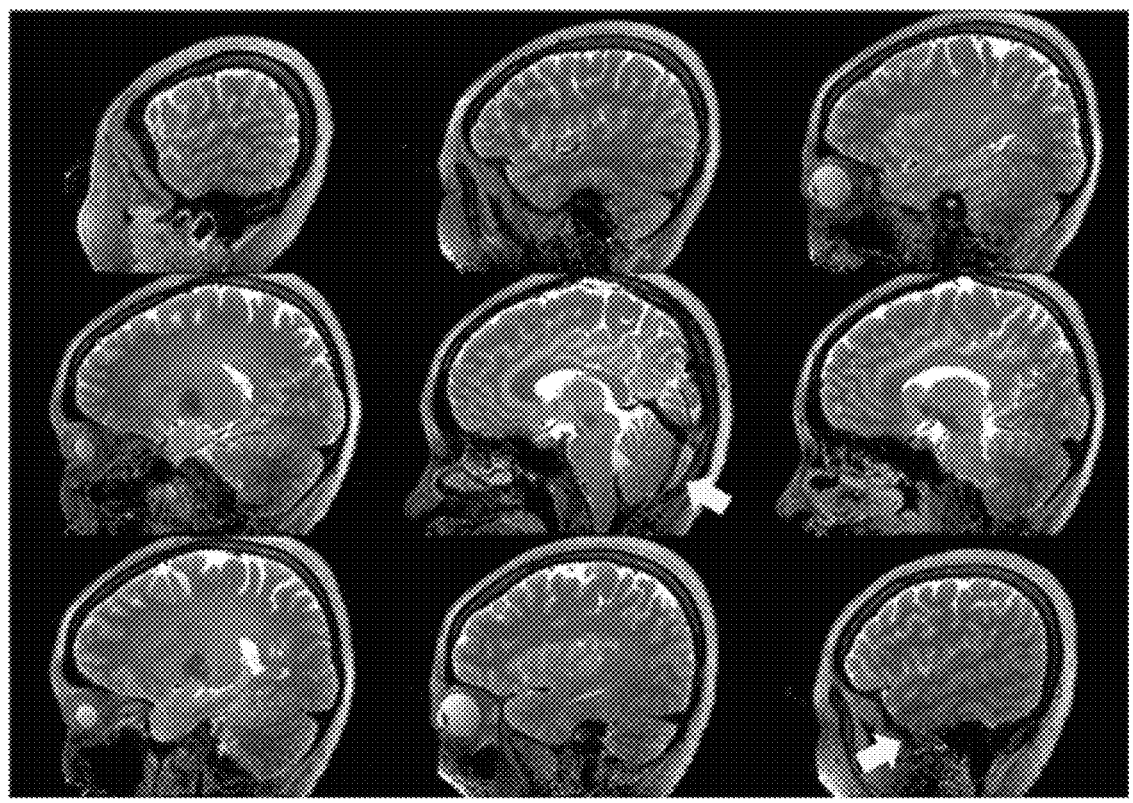
FIG. 10 is a schematic diagram of an image obtained after correcting FIG. 8 using the method according to the fourth aspect of the present disclosure.

FIG. 10 shows an image obtained after correcting FIG. 8 using the method according to the fourth aspect of the present disclosure, in which the positions of the 9 slices are the same as those in FIG. 8, and the function $g(T1(r),T2(r),|B_1^{+}(r)|)$ is obtained using the phase image theory. It can be seen from the 9 slices of FIG. 10 that the image intensity is more uniform, and signal voids in the temporal lobe and cerebellum are covered.

Figure 11:
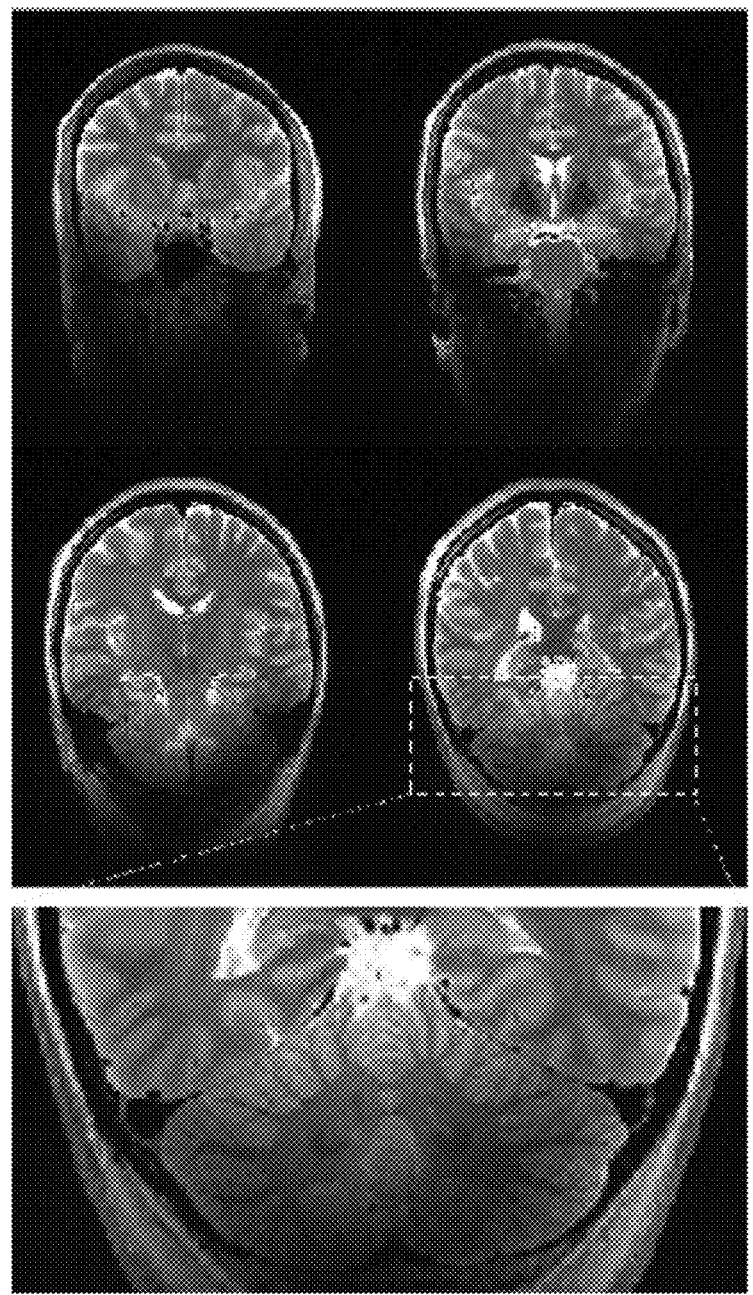
FIG. 11 is a schematic diagram of 4 slices of a T2 weighted image obtained by performing MR scanning on a target brain tissue using a 2D-TSE sequence in an application example of the present disclosure, and a schematic diagram of an enlarged view of a dashed rectangular region of the $4^{th}$ slice.

FIG. 11 shows 4 slices of a T2 weighted image obtained by performing MR scanning on a target brain tissue using a 2D Turbo Spin Echo (2D-TSE) sequence, and an enlarged view of a dashed rectangular region of the $4^{th}$ slice. The lower close-up view in this figure is the enlarged view of the dashed rectangular region of the $4^{th}$ slice. Imaging parameters are: TE/TR=54/320 ms, ETL=11, FOV=209 mm×209 mm×71.7 mm, imaging matrix=1176×1568×30, and slice thickness=2 mm. It can be seen from FIG. 11 that there are signal voids near the temporal lobe and lower cerebellar lobe.

Figure 12:
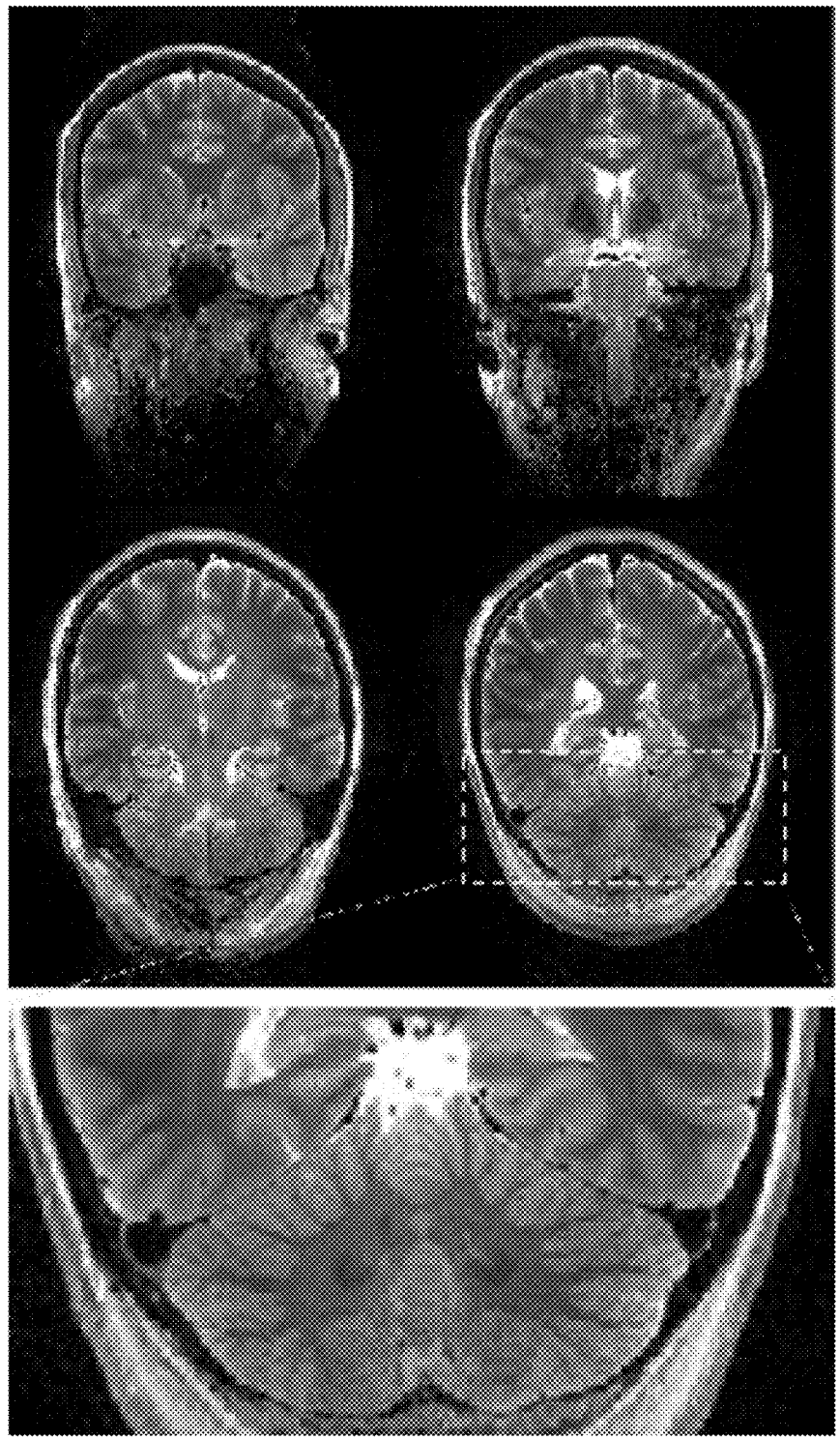
FIG. 12 is a schematic diagram of 4 slices of an image obtained after correcting FIG. 11 using the method according to the fourth aspect of the present disclosure, and a schematic diagram of an enlarged view of a dashed rectangular region of the $4^{th}$ slice.

FIG. 12 shows 4 slices of an image obtained after correcting FIG. 11 using the method according to the fourth aspect of the present disclosure, and an enlarged view of a dashed rectangular region of the $4^{th}$ slice, in which the positions of the 4 slices are the same as those in FIG. 11, and the function $g(T1(r),T2(r),|B_1^{+}(r)|)$ is obtained using the phase image theory. It can be seen from FIG. 12 that the image uniformity is greatly improved.

Figure 13:
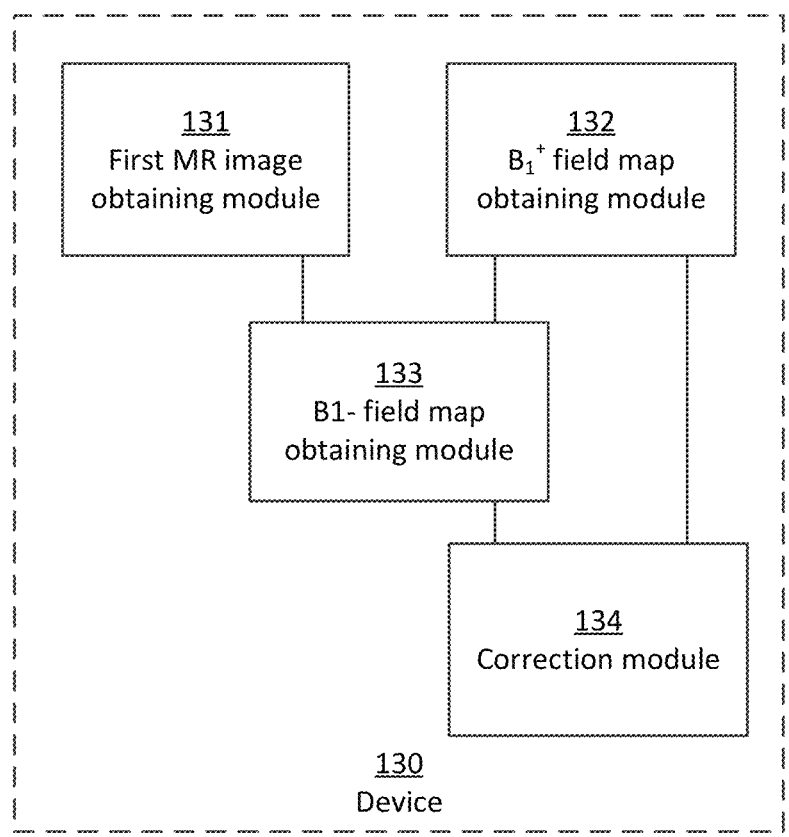
FIG. 13 is a schematic structural diagram of a device for B1 field inhomogeneity correction in MRI according to an aspect of the present disclosure.

FIG. 13 is a schematic structural diagram of a device 130 for B1 field inhomogeneity correction in MRI according to an aspect of the present disclosure. The device mainly includes a first MR image obtaining module 131, a $B_1^{+}$ field map obtaining module 132, a $B_1^{-}$ field map obtaining module 133, and a correction module 134.

The first MR image obtaining module 131 is configured to obtain a first MR image by scanning a target tissue using a first pulse sequence.

The $B_1^{+}$ field map obtaining module 132 is configured to obtain a $B_1^{+}$ field map of the target tissue.

The $B_1^{-}$ field map obtaining module 133 is configured to obtain a $B_1^{-}$ field map of the target tissue based on the first MR image obtained by the first MR image obtaining module 131 and the $B_1^{+}$ field map obtained by the $B_1^{+}$ field map obtaining module 132.

The correction module 134 is configured to perform B1 field inhomogeneity correction on a second MR image of the target tissue based on the $B_1^{+}$ field map obtained by the $B_1^{+}$ field map obtaining module 132 and the $B_1^{-}$ field map obtained by the $B_1^{-}$ field map obtaining module 133, where the second MR image is an MR image obtained by scanning the target tissue using any imaging protocol and any pulse sequence.

In an optional aspect, the $B_1^{-}$ field map obtaining module 133 is specifically configured to:

for any voxel of the target tissue, obtain a first residual intensity of an MR signal for the voxel during a first scanning process based on T1, T2, TE, TR and a flip angle of the voxel during the first scanning process, and a relative intensity of a $B_1^{+}$ field corresponding to the voxel on the $B_1^{+}$ field map; and obtain an absolute value of an intensity of a $B_1^{-}$ field for the voxel based on the intensity of the MR signal corresponding to the voxel on the first MR image, a proton density of the voxel, the first residual intensity of the MR signal for the voxel, the flip angle of the voxel during the first scanning process, and an absolute value of the relative intensity of the $B_1^{+}$ field corresponding to the voxel on the $B_1^{+}$ field map, where absolute values of intensities of $B_1^{-}$ fields for all voxels of the target tissue constitute the $B_1^{-}$ field map of the target tissue. The first residual intensity of the MR signal is a residual intensity of the MR signal for the voxel after impacts of the proton density, a sinusoidal value of a product of the flip angle and the absolute value of the relative intensity of the $B_1^{+}$ field, and the $B_1^{-}$ field are removed during the first scanning process, and the first scanning process is a scanning process for obtaining the first MR image.

In an optional aspect, obtaining, by the $B_1^{-}$ field map obtaining module 133, an absolute value of an intensity of a $B_1^{-}$ field for the voxel based on the intensity of the MR signal corresponding to the voxel on the first MR image, a proton density of the voxel, the first residual intensity of the MR signal for the voxel, the flip angle of the voxel during the first scanning process, and an absolute value of the relative intensity of the $B_1^{+}$ field corresponding to the voxel on the $B_1^{+}$ field map includes: multiplying the proton density of the voxel by the first residual intensity of the MR signal for the voxel, to obtain a first product; multiplying the flip angle of the voxel during the first scanning process by the absolute value of the relative intensity of the $B_1^{+}$ field corresponding to the voxel on the $B_1^{+}$ field map, to obtain a second product; obtaining a sinusoidal value of the second product; multiplying the first product by the sinusoidal value of the second product, to obtain a third product; and dividing the intensity of the MR signal corresponding to the voxel on the first MR image by the third product, and then using the obtained quotient value as the absolute value of the intensity of the $B_1^{-}$ field for the voxel.

In an optional aspect, obtaining, by the $B_1^{-}$ field map obtaining module 133, a first residual intensity of an MR signal for the voxel during a first scanning process based on T1, T2, TE, TR and a flip angle of the voxel during the first scanning process, and a relative intensity of a $B_1^+$ field corresponding to the voxel on the $B_1^+$ field map includes: obtaining a function expression between T1, T2, TE, TR, the flip angle and the relative intensity of the $B_1^+$ field and the intensity of the MR signal using a Bloch equation or a phase image theory, and performing, using the function expression, calculation on T1, T2, TE, TR and the flip angle of the voxel during the first scanning process and the relative intensity of the $B_1^+$ field corresponding to the voxel on the $B_1^+$ field map, to obtain the first residual intensity of the MR signal for the voxel during the first scanning process.

In an optional aspect, the first pulse sequence used by the first MR image obtaining module 131 is a low-flip-angle gradient recalled echo pulse sequence.

The $B_1^-$ field map obtaining module 133 is specifically configured to:

for any voxel of the target tissue, set a product of the proton density of the voxel and the first residual intensity of the MR signal for the voxel during the first scanning process to be a first constant; and obtain the absolute value of the intensity of the $B_1^-$ field for the voxel based on the intensity of the MR signal corresponding to the voxel on the first MR image, the first constant, the flip angle of the voxel during the first scanning process, and the absolute value of the relative intensity of the $B_1^+$ field corresponding to the voxel on the $B_1^+$ field map. The first residual intensity of the MR signal is a residual intensity of the MR signal for the voxel after impacts of the proton density, a sinusoidal value of a product of the flip angle and the absolute value of the relative intensity of the $B_1^+$ field, and the $B_1^-$ field are removed during the first scanning process, and the first scanning process is a scanning process for obtaining the first MR image.

In an optional aspect, the first pulse sequence used by the first MR image obtaining module 131 is a low-flip-angle gradient recalled echo pulse sequence.

The $B_1^-$ field map obtaining module 133 is specifically configured to:

for any voxel of the target tissue, set a product of the proton density of the voxel and the first residual intensity of the MR signal for the voxel during the first scanning process to be a first constant; obtain an absolute value of a product of the relative intensity of the $B_1^+$ field for the voxel and an intensity of the $B_1^-$ field for the voxel based on an intensity of an MR signal corresponding to the voxel on the first MR image, the first constant, and the flip angle of the voxel during the first scanning process; upon obtaining absolute values of products of relative intensities of $B_1^+$ fields for all voxels of the target tissue and intensities of $B_1^-$ fields for all the voxels of the target tissue, fit the absolute values of the products of the relative intensities of the $B_1^-$ fields for all the voxels of the target tissue and the intensities of the $B_1^-$ fields for all the voxels of the target tissue using a preset three-dimensional spline fitting algorithm, to obtain a three-dimensional spline fitting plot for the absolute values of the products of the relative intensities of the $B_1^+$ fields of the target tissue and the intensities of the $B_1^-$ fields of the target tissue; and for any voxel of the target tissue, divide a signal intensity corresponding to the voxel on the three-dimensional spline fitting plot by the absolute value of the relative intensity of the $B_1^+$ field corresponding to the voxel on the $B_1^+$ field map, to obtain the absolute value of the intensity of the $B_1^-$ field for the voxel. The first residual intensity of the MR signal is a residual intensity of the MR signal for the voxel after impacts of the proton density, a sinusoidal value of a product of the flip angle and the absolute value of the relative intensity of the $B_1^+$ field, and the $B_1^-$ field are removed during the first scanning process, and the first scanning process is a scanning process for obtaining the first MR image.

In an optional aspect, a low-flip-angle pulse sequence used by the first MR image obtaining module 131 is a single-echo gradient recalled echo sequence, a multi-echo gradient recalled echo sequence, or an EPI sequence.

In an optional aspect, before obtaining the first magnetic resonance (MR) image, the first MR image obtaining module 131 is further configured to: when a plurality of MR images are obtained after scanning of the target tissue using a low-flip-angle first pulse sequence, select, from the plurality of MR images, an image with the lowest tissue contrast as the first MR image.

In an optional aspect, the correction module 134 is specifically configured to:

for any voxel of the target tissue, obtain a second residual intensity of an MR signal for the voxel during a second scanning process based on T1 and T2 of the voxel during the second scanning process and a relative intensity of a $B_1^+$ field corresponding to the voxel on the $B_1^+$ field map; and obtain an intensity of an MR signal corresponding to the voxel, with B1 inhomogeneity correction completed, on the second MR image, based on the intensity of the MR signal corresponding to the voxel on the second MR image, the absolute value of the intensity of the $B_1^-$ field for the voxel, and the second residual intensity of the MR signal. The second residual intensity of the MR signal is a residual intensity of the MR signal for the voxel after impacts of both the proton density and the $B_1^-$ field are removed during the second scanning process, and the second scanning process is a scanning process for obtaining the second MR image.

In an optional aspect, obtaining, by the correction module 134, a second residual intensity of an MR signal for the voxel during a second scanning process based on T1 and T2 of the voxel during the second scanning process, and a relative intensity of a $B_1^+$ field corresponding to the voxel on the $B_1^+$ field map includes: obtaining a function expression between T1, T2 and the relative intensity of the $B_1^+$ field and the intensity of the MR signal using a Bloch equation or a phase image theory; and performing, using the function expression, calculation on T1 and T2 of the voxel during the second scanning process and the relative intensity of the $B_1^+$ field corresponding to the voxel on the $B_1^+$ field map, to obtain the second residual intensity of the MR signal for the voxel during the second scanning process.

An aspect of the present disclosure further provides an MR scanner including the device 130 for B1 field inhomogeneity correction in MRI as described above.

The above descriptions are merely preferred aspects of the present disclosure, but not intended to limit the present disclosure. Any modifications, equivalent substitutions, improvements, etc. made within the spirit and principle of the present disclosure should be included within the scope of protection of the present disclosure.

The invention claimed is:

1. A method for radio-frequency field inhomogeneity correction in magnetic resonance imaging, comprising:
   obtaining a first magnetic resonance image by scanning a target tissue using a first pulse sequence;
   obtaining a transmit radio-frequency field B1+ field map of the target tissue;
   obtaining a receive radio-frequency field B1− field map composed of absolute values of intensities of a $B_1^-$ field of the target tissue based on the first magnetic resonance image and the B1+ field map; and performing B1 field inhomogeneity correction on a second magnetic resonance image of the target tissue based on the B1+ field map and the B1− field map, wherein the second magnetic resonance image is a magnetic resonance image obtained after scanning of the target tissue using any imaging protocol and any pulse sequence.

2. The method according to claim 1, wherein the obtaining a B1− field map of the target tissue based on the first magnetic resonance image and the B1+ field map comprises:

for any voxel of the target tissue, obtaining a first residual intensity of a magnetic resonance signal for the voxel during a first scanning process based on a longitudinal relaxation time T1, a transverse relaxation time T2, an echo time TE, a repetition time TR and a flip angle of the voxel during the first scanning process, and a relative intensity of a B1+ field corresponding to the voxel on the B1+ field map, wherein the first residual intensity of the magnetic resonance signal is a residual intensity of the magnetic resonance signal for the voxel after impacts of a proton density, a sinusoidal value of a product of the flip angle and an absolute value of the relative intensity of the B1+ field, and a B1− field are removed during the first scanning process, and the first scanning process is a scanning process for obtaining the first magnetic resonance image; and obtaining the absolute value of an intensity of the B1− field for the voxel based on the intensity of the magnetic resonance signal corresponding to the voxel on the first magnetic resonance image, the proton density of the voxel, the first residual intensity of the magnetic resonance signal for the voxel, the flip angle of the voxel during the first scanning process, and the absolute value of the relative intensity of the B1+ field corresponding to the voxel on the B1+ field map, wherein absolute values of intensities of B1− fields for all voxels of the target tissue constitute the B1− field map of the target tissue.

3. The method according to claim 2, wherein the obtaining the absolute value of an intensity of the B1− field for the voxel based on the intensity of the magnetic resonance signal corresponding to the voxel on the first magnetic resonance image, the proton density of the voxel, the first residual intensity of the magnetic resonance signal for the voxel, the flip angle of the voxel during the first scanning process, and the absolute value of the relative intensity of the B1+ field corresponding to the voxel on the B1+ field map, comprises:

multiplying the proton density of the voxel by the first residual intensity of the magnetic resonance signal, to obtain a first product; multiplying the flip angle of the voxel during the first scanning process by the absolute value of the relative intensity of the B1+ field corresponding to the voxel on the B1+ field map, to obtain a second product;

obtaining a sinusoidal value of the second product;

multiplying the first product by the sinusoidal value of the second product, to obtain a third product; and dividing the intensity of the magnetic resonance signal corresponding to the voxel on the first magnetic resonance image by the third product, and then using the obtained quotient value as the absolute value of the intensity of the B1− field for the voxel.

4. The method according to claim 2, wherein the obtaining a first residual intensity of a magnetic resonance signal for the voxel during a first scanning process based on T1, T2, TE, TR and a flip angle of the voxel during the first scanning process, and a relative intensity of a B1+ field corresponding to the voxel on the B1+ field map, comprises:

obtaining a function expression between T1, T2, TE, TR, the flip angle and the relative intensity of the B1+ field and the intensity of the magnetic resonance signal using a Bloch equation or a phase image theory, and performing, using the function expression, calculation on T1, T2, TE, TR and the flip angle of the voxel during the first scanning process and the relative intensity of the B1+ field corresponding to the voxel on the B1+ field map, to obtain the first residual intensity of the magnetic resonance signal for the voxel during the first scanning process.

5. The method according to claim 1, wherein:

the first pulse sequence is a low-flip-angle gradient recalled echo pulse sequence; and the obtaining a B1− field map of the target tissue based on the first magnetic resonance image and the B1+ field map comprises:

for any voxel of the target tissue, setting a product of a proton density of the voxel and a first residual intensity of a magnetic resonance signal for the voxel during a first scanning process to be a first constant, wherein the first residual intensity of the magnetic resonance signal is a residual intensity of the magnetic resonance signal for the voxel after impacts of the proton density, a sinusoidal value of a product of a flip angle and an absolute value of a relative intensity of a B1+ field, and a B1− field are removed during the first scanning process, and the first scanning process is a scanning process for obtaining the first magnetic resonance image; and obtaining the absolute value of an intensity of the B1− field for the voxel based on the intensity of the magnetic resonance signal corresponding to the voxel on the first magnetic resonance image, the first constant, the flip angle of the voxel during the first scanning process, and the absolute value of the relative intensity of the B1+ field corresponding to the voxel on the B1+ field map, wherein absolute values of intensities of B1− fields for all voxels of the target tissue constitute the B1− field map of the target tissue.

6. The method according to claim 1, wherein:

the first pulse sequence is a low-flip-angle gradient recalled echo pulse sequence; and the obtaining a B1− field map of the target tissue based on the first magnetic resonance image and the B1+ field map comprises:

for any voxel of the target tissue, setting a product of a proton density of the voxel and a first residual intensity of a magnetic resonance signal for the voxel during a first scanning process to be a first constant, wherein the first residual intensity of the magnetic resonance signal is a residual intensity of the magnetic resonance signal for the voxel after impacts of the proton density, a sinusoidal value of a product of a flip angle and an absolute value of a relative intensity of a B1+ field, and a B1− field are removed during the first scanning process, and the first scanning process is a scanning process for obtaining the first magnetic resonance image; and obtaining an absolute value of a product of the relative intensity of the B1+ field for the voxel and an intensity of the B1− field for the voxel based on the intensity of the magnetic resonance signal corresponding to the voxel on the first magnetic resonance image, the first constant, and the flip angle of the voxel during the first scanning process;

upon obtaining absolute values of products of relative intensities of B1+ fields for all voxels of the target tissue and intensities of B1− fields for all the voxels of the target tissue, fitting the absolute values of the products of the relative intensities of the B1+ fields for all the voxels of the target tissue and the intensities of the B1− fields for all the voxels of the target tissue using a preset three-dimensional spline fitting algorithm, to obtain a three-dimensional spline fitting plot for the absolute values of the products of the relative intensities of the B1+ fields of the target tissue and the intensities of the B1− fields of the target tissue; and for any voxel of the target tissue, dividing a signal intensity corresponding to the voxel on the three-dimensional spline fitting plot by an absolute value of a relative intensity of the B1+ field corresponding to the voxel on the B1+ field map, to obtain the absolute value of the intensity of the B1− field for the voxel, wherein absolute values of intensities of B1− fields for all voxels of the target tissue constitute the B1− field map of the target tissue.

7. The method according to claim 5, wherein the low-flip-angle gradient recalled echo pulse sequence is a single-echo gradient recalled echo sequence, a multi-echo gradient recalled echo sequence, or an echo planar imaging sequence.

8. The method according to claim 5, wherein before obtaining the first magnetic resonance (MR) image, the method further comprises:

when a plurality of MR images are obtained after scanning of the target tissue using a low-flip-angle first pulse sequence, selecting, from the plurality of MR images, an image with the lowest tissue contrast as the first magnetic resonance image.

9. The method according to claim 1, wherein the performing B1 field inhomogeneity correction on a second magnetic resonance image of the target tissue based on the B1+ field map and the B1− field map comprises:

for any voxel of the target tissue, obtaining a second residual intensity of a magnetic resonance signal for the voxel during a second scanning process based on T1 and T2 of the voxel during the second scanning process and a relative intensity of a B1+ field corresponding to the voxel on the B1+ field map, wherein the second residual intensity of the magnetic resonance signal is a residual intensity of the magnetic resonance signal for the voxel after impacts of a proton density and a B1− field are removed during the second scanning process, and the second scanning process is a scanning process for obtaining the second magnetic resonance image; and obtaining an intensity of a magnetic resonance signal corresponding to a voxel, with B1 inhomogeneity correction completed, on the second magnetic resonance image, based on the intensity of the magnetic resonance signal corresponding to the voxel on the second magnetic resonance image, the absolute value of the intensity of the B1− field for the voxel, and the second residual intensity of the magnetic resonance signal.

10. The method according to claim 9, wherein the obtaining a second residual intensity of a magnetic resonance signal for the voxel during a second scanning process based on T1 and T2 of the voxel during the second scanning process and a relative intensity of a B1+ field corresponding to the voxel on the B1+ field map comprises:

obtaining a function expression between T1, T2 and the relative intensity of the B1+ field and the intensity of the magnetic resonance signal using a Bloch equation or a phase image theory, and performing, using the function expression, calculation on T1 and T2 of the voxel during the second scanning process and the relative intensity of the B1+ field corresponding to the voxel on the B1+ field map, to obtain the second residual intensity of the magnetic resonance signal for the voxel during the second scanning process.

11. A device for radio-frequency field inhomogeneity correction in magnetic resonance imaging, the device comprising:

a first magnetic resonance MR image obtaining module configured to obtain a first magnetic resonance image by scanning a target tissue using a first pulse sequence;

a transmit radio-frequency B1+ field map obtaining module configured to obtain a B1+ field map of the target tissue;

a receive radio-frequency B1− field map obtaining module configured to obtain a B1-field map composed of absolute values of intensities of a B1⁻ field of the target tissue based on the first magnetic resonance image and the B1+ field map; and a correction module configured to perform B1 field inhomogeneity correction on a second magnetic resonance image of the target tissue based on the B1+ field map and the B1-field map.

12. A magnetic resonance scanner, comprising the device for radio-frequency field inhomogeneity correction in magnetic resonance imaging of claim 11.

* * * * *